US008422270B2

(12) United States Patent
Kawabata et al.

(10) Patent No.: US 8,422,270 B2
(45) Date of Patent: Apr. 16, 2013

(54) NONVOLATILE SEMICONDUCTOR MEMORY DEVICE

(75) Inventors: Suguru Kawabata, Osaka (JP); Shinobu Yamazaki, Osaka (JP); Yoshiji Ohta, Osaka (JP); Kazuya Ishihara, Osaka (JP); Nobuyoshi Awaya, Osaka (JP); Akio Kitagawa, Kanazawa (JP); Kazuya Nakayama, Kanazawa (JP)

(73) Assignees: Sharp Kabushiki Kaisha, Osaka (JP); National University Corporation Kanazawa University, Ishikawa (JP)

( * ) Notice: Subject to any disclaimer, the term of this patent is extended or adjusted under 35 U.S.C. 154(b) by 238 days.

(21) Appl. No.: 13/044,892

(22) Filed: Mar. 10, 2011

(65) Prior Publication Data

US 2011/0228586 A1   Sep. 22, 2011

(30) Foreign Application Priority Data

Mar. 17, 2010   (JP) .................................. 2010-060188

(51) Int. Cl.
*G11C 11/34*   (2006.01)
(52) U.S. Cl.
USPC ........................ 365/148; 365/163; 365/189.09
(58) Field of Classification Search .................... 365/34, 365/69
See application file for complete search history.

(56) References Cited

U.S. PATENT DOCUMENTS

| 6,259,644 | B1 | 7/2001 | Tran et al. | |
| 7,283,387 | B2* | 10/2007 | Cho et al. | 365/163 |
| 7,283,407 | B2 | 10/2007 | Inoue et al. | |
| 8,085,577 | B2* | 12/2011 | Kanno et al. | 365/148 |
| 8,223,530 | B2* | 7/2012 | Kitagawa | 365/148 |

FOREIGN PATENT DOCUMENTS

| JP | 2002-008369 | 1/2002 |
| JP | 2006-155846 | 6/2006 |

* cited by examiner

*Primary Examiner* — Tan T. Nguyen
(74) *Attorney, Agent, or Firm* — Nixon & Vanderhye, P.C.

(57) ABSTRACT

A nonvolatile semiconductor memory device includes a bit voltage adjusting circuit which, for each bit line, fixes potentials of a selected bit line and a non-selected bit line to a predetermined potential to perform a memory operation and a data voltage adjusting circuit which, for each data line, fixes potentials of a selected data line and a non-selected data line to a predetermined potential to perform a memory operation. Each of the voltage adjusting circuits includes an operational amplifier and a transistor, a voltage required for a memory operation is input to the non-inverted input terminal of the operational amplifier, and the inverted input terminal of the operational amplifier is connected to the bit line or the data line, so that the potential of the bit line or the data line is fixed to a potential of the non-inverted input terminal of the operational amplifier.

12 Claims, 18 Drawing Sheets

To Bit Line

11

12

To Data Line

To Bit Line

11

To Data Line

NONVOLATILE SEMICONDUCTOR MEMORY DEVICE

CROSS REFERENCE TO RELATED APPLICATION

This Nonprovisional application claims priority under 35 U.S.C. §119(a) on Patent Application No. 2010-060188 filed in Japan on Mar. 17, 2010 the entire contents of which are hereby incorporated by reference.

BACKGROUND OF THE INVENTION

1. Field of the Invention

The present invention relates to a nonvolatile semiconductor memory device, more specifically, a nonvolatile semiconductor memory device having a cross-point type memory cell array in which a plurality of two-terminal memory cells each having a nonvolatile variable resistance elements are arranged in the form of a matrix in a row direction and a column direction, one terminals of memory cells belonging to the same row are connected to the same row selecting line, and the other terminals of memory cells belonging to the same column are connected to the same column selecting line.

2. Description of the Related Art

In recent years, a cross-point type semiconductor memory device (to be arbitrarily referred to as a "cross-point memory" hereinafter) in which memory cells do not include selective elements except for memory elements, and memory elements are directly connected to a column selecting line (to be referred to as a "data line" hereinafter) and a row selecting line (to be referred to as a "bit line" hereinafter) to form a memory cell array.

In the cross-point memory, since the memory cell array can be simplified and advantageous to integration but does not include a selecting transistor for each memory cell, control of a leakage current generated in reading and programming is a very important problem as described in Japanese Unexamined Patent Publication No. 2006-155846.

In this case, the leakage current means a leak current generated depending on a resistance distribution in a memory cell array through a non-selected memory cell. A cause of generation of a leakage current will be briefly described below with reference to a memory cell array 90 shown in FIG. 17.

In order to perform reading from a selected memory cell $M_{11}$, for example, a voltage Vread (selected bit line voltage) is applied to a bit line B1 connected to a selected memory cell, a voltage Vbias (non-selected bit line voltage) is applied to bit lines B2 and B3 connected to a non-selected memory cell, and the voltage Vbias is applied to data lines D1 to D3. A voltage Vread-Vbias is applied across two terminals of a selected memory cell, and an amount of current flowing in the data line (selected data line) D1 connected to the selected memory cell is read by a sense amplifier. However, a current (current path IA in FIG. 17) flowing in the selected data line D1 is a sum of a current flowing in the selected memory cell $M_{11}$ and a current flowing in half-selected memory cells $M_{21}$ and $M_{31}$ connected to the selected data line D1 and connected to the non-selected bit lines B2 and B3, respectively. A non-selected memory cell connected to a bit line and a data line one of which is selected and the other of which is non-selected will be called a "half-selected memory cell" hereinafter.

Since the voltage Vbias is applied to a selected data line and a non-selected bit line, no current flows in a memory cell connected to the selected data line and the non-selected bit line in principle. However, since a voltage on a selected data line side of the selected memory cell is divided by a resistance of a driver which drives the data line and a resistance of the selected memory cell (furthermore, a resistance of a driver which drives the bit line), the voltage actually varies from Vbias depending on a resistance state stored in the selected memory cell. Similarly, a potential of the non-selected bit line also varies depending on a resistance state stored in the memory cell.

In this manner, since a potential difference is generated between the selected data line and the non-selected bit line, a leakage current flowing from the selected data line D1 to the non-selected bit lines B2 and B3 through the half-selected memory cells $M_{21}$ and $M_{31}$ or from the non-selected bit lines B2 and B3 to the selected data line D1 through the half-selected memory cells $M_{21}$ and $M_{31}$ is generated. Furthermore, when the potential difference is generated between the non-selected data line and the non-selected bit line, a current flowing from the non-selected bit line to the non-selected data line or from the non-selected data line to the non-selected bit line is generated. For this reason, for example, when a current flowing from a non-selected data line D2 to the non-selected bit line B2 is generated, the current flows from the non-selected data line D2 to the selected data line D1 through a non-selected memory cell $M_{22}$, a non-selected bit line B2, and the half-selected memory cell $M_{21}$ (current path IB in FIG. 17) to cause an increase in leakage current. The increase in leakage current through the non-selected bit line and the non-selected data line is an outstanding problem because the number of non-selected lines increases when an array size becomes large.

As a conventional technique of the leakage current control, a circuit configuration of a voltage suppressing circuit described in Japanese Unexamined Patent Publication No. 2006-155846 is shown in FIG. 18.

A voltage suppressing circuit 91 in FIG. 18 has one terminal connected to a data line or a bit line of a memory cell array 90 and the other terminal connected to a voltage supply circuit. An ON resistance of a transistor 92 is controlled by an output from an inverter 93, and an output from the inverter 93 is controlled by a signal level of a data line or a bit line. Therefore, a voltage supplied to the data line or the bit line is adjusted by an inversion level of the inverter 93 and a threshold voltage of the transistor 92.

However, when the voltage suppressing circuit 91 tries to solve the problem of a leakage current, the voltage suppressing circuit naturally detects a variation in voltage and then adjusts a voltage, leakage (to be referred to as "initial leakage" hereinafter) occurs in a short period from when the voltage varies to when the voltage is adjusted.

This will be described with reference to an example in FIG. 18, the gate of the transistor 92 is not opened or closed until the inverter 93 detects a variation in voltage of the data line or the bit line. Since the transistor 92 does not operate until the voltage of the data line or the bit line actually departs from a default value, a moment in which an unexpected initial leakage current flows is necessarily present independently of the capability of the inverter 93 or the transistor 92.

A resistive random access memory is expected to be practically used as a high-speed memory having a large capacitance and a speed of several nanoseconds, and so the initial leakage is an unignorable problem in an array size or an operation speed at a practical-use level.

SUMMARY OF THE INVENTION

The present invention is proposed to the problem of the initial leakage described above and its object is to realize a stable high-speed memory operation with a suppressed leakage current in a nonvolatile semiconductor memory device which has a memory cell array having nonvolatile variable resistance elements.

A nonvolatile semiconductor memory device according to a first characteristic feature of the present invention to achieve the above object is a nonvolatile semiconductor memory device having a two-dimensional memory cell array in which a plurality of two-terminal memory cells each having a nonvolatile variable resistance element which stores information by a change in electric resistance are arranged in the form of a matrix in a first direction and a second direction perpendicular to each other, a plurality of bit lines extending in the first direction and a plurality of data lines extending in the second direction are arranged, one terminals of the memory cells located at the same position in the first direction are commonly connected to one of the data lines, and the other terminals of the memory cells located at the same position in the second direction are commonly connected to one of the bit lines, the nonvolatile semiconductor memory device including: a bit line voltage supply circuit which supplies, for each of the bit lines, a predetermined first voltage to a selected bit line connected to the other terminal of the memory cell selected as an object to be read and supplies a predetermined second voltage to a non-selected bit line connected to the other terminal of the non-selected memory cell serving as an object not to be read; a data line voltage supply circuit which supplies the second voltage to a selected data line connected to one terminal of the memory cell selected as an object to be read and a non-selected data line connected to one terminal of the non-selected memory cell serving as an object not to be read; and a sense circuit which detects a current flowing in the selected data line separately from a current flowing in the non-selected data line to detect an electric resistance state of the selected memory cell in reading, wherein the data line voltage supply circuit has a data line selecting circuit which independently sets each of the data lines to any one of the selected data line and the non-selected data line, the bit line voltage supply circuit has a bit line selecting circuit which independently sets each of the bit lines to any one of the selected bit line and the non-selected bit line and a bit line voltage adjusting circuit, the bit line voltage adjusting circuit has a first operational amplifier and a MOS transistor having a gate terminal connected to an output terminal of the first operational amplifier, a drain terminal connected to an inverted input terminal of the first operational amplifier, and a source terminal connected to a predetermined fixed potential, any one of the first voltage and the second voltage is applied to a non-inverted input terminal of the first operational amplifier to fix a voltage of the inverted input terminal of the first operational amplifier to any one of the first voltage and the second voltage which is a voltage of the non-inverted input terminal of the first operational amplifier, and the fixed voltage is supplied from the MOS transistor to the bit line through a connection node between the drain terminal of the MOS transistor and the inverted input terminal of the first operational amplifier.

The nonvolatile semiconductor memory device according to the first characteristic feature preferably further includes a configuration in which the bit line voltage adjusting circuit is provided for each of the bit lines or each bit line group obtained by connecting the predetermined number of bit lines through corresponding selecting elements, the voltage of the inverted input terminal of the first operational amplifier of the corresponding bit line voltage adjusting circuit is fixed to the first voltage serving as the voltage of the non-inverted input terminal of the first operational amplifier depending on an output from the bit line selecting circuit when the bit line is the selected bit line or when the bit line group includes the selected bit line, and the voltage of the inverted input terminal of the first operational amplifier of the corresponding bit line voltage adjusting circuit is fixed to the second voltage serving as the voltage of the non-inverted input terminal of the first operational amplifier depending on the output from the bit line selecting circuit when the bit line is the non-selected bit line or when all the bit lines belonging to the bit line group are the non-selected bit lines.

The nonvolatile semiconductor memory device according to the first characteristic feature preferably includes a configuration in which the bit line voltage supply circuit includes a first bit line voltage adjusting circuit which fixes the voltage of the inverted input terminal of the first operational amplifier to the second voltage serving as the voltage of the non-inverted input terminal of the first operational amplifier and supplies the fixed second voltage to the non-selected bit line through the connection node between the drain terminal of the MOS transistor and the inverted input terminal of the first operational amplifier and the bit line selecting circuit.

The nonvolatile semiconductor memory device according to the first characteristic feature preferably includes a configuration in which the bit line voltage supply circuit includes a second bit line voltage adjusting circuit which fixes the voltage of the inverted input terminal of the first operational amplifier to the first voltage serving as the voltage of the non-inverted input terminal of the first operational amplifier and supplies the fixed first voltage to the selected bit line through the connection node between the drain terminal of the MOS transistor and the inverted input terminal of the first operational amplifier and the bit line selecting circuit.

According to the nonvolatile semiconductor memory device of the first characteristic feature, the bit line voltage adjusting circuit to fix a voltage of a bit line to a predetermined potential is arranged in the bit line voltage supply circuit, and the bit line voltage adjusting circuit is configured by an OP Amp (operational amplifier) and a transistor. With the above configuration, when a degree of amplification of the OP Amp is sufficiently large, by an effect of a virtual short of the OP Amp, a potential of a bit line directly connected to the inverted input terminal of the OP Amp or indirectly connected to the inverted input terminal through the bit line selecting circuit is fixed to the potential of the non-inverted input terminal of the OP Amp without being influenced by a resistance distribution of memory cells connected to the bit line. Since the first voltage (Vread) is applied to the non-inverted input terminal of the OP Amp with respect to a selected bit line or the second voltage (Vbias) is applied to the non-inverted input terminal with respect to a non-selected bit line, a potential of the selected bit line is immediately fixed to the first voltage and a potential of the non-selected bit line is immediately fixed to the second voltage.

In this manner, independently of the resistance distribution of the variable resistance elements of the memory cells connected to each of the bit lines, a voltage of one terminal of a variable resistance element of a memory cell connected to the selected bit line or the non-selected bit line can be immediately fixed to the predetermined potential, and initial leakage in reading is suppressed independently of the resistance distribution of the variable resistance elements. Since the resistance of the variable resistance element can be prevented from being written by an unexpected variation in voltage of a bit line, disturb is suppressed, and a read margin can be expected to be improved.

The plurality of bit line voltage adjusting circuits may be arranged for each of the bit lines or each of the bit line groups each having the predetermined number of bit lines, and any one of the first voltage fixed to the selected bit line and the second voltage fixed to the non-selected bit line is supplied depending on a voltage input to the non-inverted input terminal of the OP Amp. The first bit line voltage adjusting circuit to fix the potential of the non-selected bit line to the second voltage and the second bit line voltage adjusting circuit to fix the potential of the selected bit line to the first voltage may be arranged, and the voltage fixed by any one of the bit line voltage adjusting circuits may be supplied through the bit line selecting circuit.

The nonvolatile semiconductor memory device according to the first characteristic feature preferably further includes a configuration in which the data line voltage supply circuit includes a first data line voltage adjusting circuit, the first data line voltage adjusting circuit includes a second operational amplifier and a second MOS transistor having a gate terminal connected to an output terminal of the second operational amplifier, a drain terminal connected to an inverted input terminal of the second operational amplifier, and a source terminal connected to a predetermined fixed potential, the second voltage is applied to the non-inverted input terminal of the second operational amplifier to fix the voltage of the inverted input terminal of the second operational amplifier to the second voltage serving as the voltage of the non-inverted input terminal of the second operational amplifier, and the fixed second voltage is supplied from the second MOS transistor to the non-selected data line through a connection node between the drain terminal of the second MOS transistor and the inverted input terminal of the second operational amplifier and the data line selecting circuit.

Since the nonvolatile semiconductor memory device include the first data line adjusting circuit, as in the above bit line voltage adjusting circuit, by an effect of a virtual short of the OP Amp, a potential of a non-selected data line connected to the inverted input terminal of the OP Amp through the data line selecting circuit is fixed to a potential of a non-inverted input terminal of the OP Amp without being influenced by a resistance distribution of memory cells connected to the data line. More specifically, the potential of the non-selected data line is immediately fixed to the second voltage (Vbias).

In this manner, a voltage of one terminal of a variable resistance element of a memory cell connected to a non-selected data line can be immediately fixed to the predetermined second voltage independently of a resistance distribution of variable resistance elements of memory cells connected to each of the data lines, and initial leakage in reading is suppressed independently of the resistance distribution of the variable resistance elements. Since a resistance of a variable resistance element can be prevented from being written by an unexpected variation in voltage of a non-selected data line, disturb is suppressed, and a read margin can be expected to be improved.

The nonvolatile semiconductor memory device according to the first characteristic feature preferably further includes a configuration in which the sense circuits the number of which is greater than or equal to the number of selected data lines are provided, the data line voltage supply circuit includes second data line voltage adjusting circuits the number of which is greater than or equal to the number of selected data lines, each of the second data line voltage adjusting circuits includes a third operational amplifier and a third MOS transistor having a gate terminal connected to an output terminal of the third operational amplifier, a drain terminal connected to an inverted input terminal of the third operational amplifier, and a source terminal connected to a predetermined fixed potential, the second voltage is applied to the non-inverted input terminal of the third operational amplifier to fix a voltage of the inverted input terminal of the third operational amplifier to the second voltage serving as a voltage of the non-inverted input terminal of the third operational amplifier, and the fixed second voltage is independently supplied from the third MOS transistor to each of the selected data lines through a connection node between the drain terminal of the third MOS transistor and the inverted input terminal of the third operational amplifier and the data line selecting circuit and supplied to each of the inputs of the sense circuits through the connection node between the drain terminal of the third MOS transistor and the inverted input terminal of the third operational amplifier.

Since the nonvolatile semiconductor memory device includes the second data line voltage adjusting circuit, as in the bit line voltage adjusting circuit and the first data line voltage adjusting circuit, by an effect of a virtual short of the OP Amp, a potential of a selected data line connected to the inverted input terminal of the OP Amp through the data line selecting circuit is fixed to a potential of the non-inverted input terminal of the OP Amp without being influenced by a resistance distribution of memory cells connected to the data line. More specifically, the potential of the selected data line is immediately fixed to the second voltage (Vbias). The sense circuit is independently connected to each of the selected data lines through the data line selecting circuit. An amount of current flowing in the selected data line is detected to make it possible to read a resistance state of a selected memory cell.

In this manner, a voltage of one terminal of a variable resistance element of a memory cell connected to a selected data line can be immediately fixed to the predetermined second voltage independently of a resistance distribution of variable resistance elements of memory cells connected to each of the data lines, and initial leakage in reading is suppressed independently of the resistance distribution of the variable resistance elements. Since a resistance of a variable resistance element can be prevented from being written by an unexpected variation in voltage of a non-selected data line, disturb is suppressed, and a read margin can be expected to be improved.

The nonvolatile semiconductor memory device according to the first characteristic feature preferably further includes a configuration in which the bit line voltage supply circuit includes a circuit adapted to supply the fixed second voltage serving as the voltage of the inverted input terminal of the second operational amplifier to the non-selected bit line directly or through the bit line selecting circuit in place of the fixed second voltage serving as the voltage of the inverted input terminal of the first operational amplifier.

With the above circuit, the second voltage supplied to the non-selected bit line can be fixed to a voltage supplied to the non-selected data line. Even though unexpected noise is generated on the non-selected bit line, a potential of the non-selected data line and a potential of the non-selected bit line are made equal to each other to further suppress a leakage current in reading.

A nonvolatile semiconductor memory device according to a second characteristic feature of the present invention to achieve the above object is a nonvolatile semiconductor memory device having a two-dimensional memory cell array in which a plurality of two-terminal memory cells each having a nonvolatile variable resistance element which stores information by a change in electric resistance are arranged in the form of a matrix in a first direction and a second direction perpendicular to each other, a plurality of bit lines extending in the first direction and a plurality of data lines extending in the second direction are arranged, one terminals of the memory cells located at the same position in the first direction are connected to the data lines, and the other terminals of the memory cells located at the same position in the second direction are connected to the bit lines, the nonvolatile semiconductor memory device including: a bit line voltage supply circuit which supplies, for each of the bit lines, a predetermined first voltage to a selected bit line connected to the other terminal of the memory cell selected as an object to be read and supplies a predetermined second voltage to a non-selected bit line connected to the other terminal of the non-selected memory cell serving as an object not to be read; a data line voltage supply circuit which supplies the second voltage to a selected data line connected to one terminal of the memory cell selected as an object to be read and a non-selected data line connected to one terminal of the non-selected memory cell serving as an object not to be read; and a sense circuit which detects a current flowing in the selected data line separately from a current flowing in the non-selected data line to detect an electric resistance state of the selected memory cell in reading, wherein the bit line voltage supply circuit has a bit line selecting circuit which independently sets each of the bit lines to any one of the selected bit line and the non-selected bit line, the data line voltage supply circuit has a data line selecting circuit which independently sets each of the data lines to any one of the selected data line and the non-selected data line and a first data line voltage adjusting circuit, the first data line voltage adjusting circuit has a second operational amplifier and a second MOS transistor having a gate terminal connected to an output terminal of the second operational amplifier, a drain terminal connected to an inverted input terminal of the second operational amplifier, and a source terminal connected to a predetermined fixed potential, the second voltage is applied to a non-inverted input terminal of the second operational amplifier to fix a voltage of the inverted input terminal of the second operational amplifier to the second voltage serving as a voltage of the non-inverted input terminal of the second operational amplifier, and the fixed second voltage is supplied from the second MOS transistor to the non-selected data line through a connection node between the drain terminal of the second MOS transistor and the inverted input terminal of the second operational amplifier and the data line selecting circuit.

According to the nonvolatile semiconductor memory device of the second characteristic feature, the first data line voltage adjusting circuit adapted to fix a potential of a non-selected data line to a predetermined potential is arranged in the data line voltage supply circuit, and the first data line voltage adjusting circuit is configured by an OP Amp (operational amplifier) and a transistor. With the above configuration, when a degree of amplification of the OP Amp is sufficiently large, by an effect of a virtual short of the OP Amp, a potential of a non-selected data line connected to the inverted input terminal of the OP Amp through the data line selecting circuit is fixed to the potential of the non-inverted input terminal of the OP Amp without being influenced by a resistance distribution of memory cells connected to the non-selected data line. Since the second voltage (Vbias) supplied to the non-selected data line is supplied to the non-inverted input terminal of the OP Amp, a potential of the non-selected data line is immediately fixed to the second voltage.

In this manner, a voltage of one terminal of a variable resistance element of a memory cell connected to a non-selected data line can be immediately fixed to the predetermined second voltage independently of a resistance distribution of variable resistance elements of memory cells connected to each of the data lines, and initial leakage in reading is suppressed independently of the resistance distribution of the variable resistance elements. Since a resistance of a variable resistance element can be prevented from being written by an unexpected variation in voltage of a non-selected data line, disturb is suppressed, and a read margin can be expected to be improved.

The nonvolatile semiconductor memory device according to the second characteristic feature preferably further includes a configuration in which the sense circuits the number of which is greater than or equal to the number of selected data lines, the data line voltage supply circuit includes second data line voltage adjusting circuits the number of which is greater than or equal to the number of selected data lines, each of the second data line voltage adjusting circuits includes a third operational amplifier and a third MOS transistor having a gate terminal connected to an output terminal of the third operational amplifier, a drain terminal connected to an inverted input terminal of the third operational amplifier, and a source terminal connected to a predetermined fixed potential, the second voltage is applied to the non-inverted input terminal of the third operational amplifier to fix a voltage of the inverted input terminal of the third operational amplifier to the second voltage serving as a voltage of the non-inverted input terminal of the third operational amplifier, and the fixed second voltage is independently supplied from the third MOS transistor to each of the selected data lines through a connection node between the drain terminal of the third MOS transistor and the inverted input terminal of the third operational amplifier and the data line selecting circuit and supplied to each of the inputs of the sense circuits through the connection node between the drain terminal of the third MOS transistor and the inverted input terminal of the third operational amplifier.

Since the nonvolatile semiconductor memory device includes the second data line voltage adjusting circuit, as in the first data line voltage adjusting circuit, by an effect of a virtual short of the OP Amp, a potential of a selected data line connected to the inverted input terminal of the OP Amp through the data line selecting circuit is fixed to a potential of the non-inverted input terminal of the OP Amp without being influenced by a resistance distribution of memory cells connected to the data line. More specifically, the potential of the selected data line is immediately fixed to the second voltage (Vbias). The sense circuit is independently connected to each of the selected data lines through the data line selecting circuit. An amount of current flowing in the selected data line is detected to make it possible to read a resistance state of a selected memory cell.

In this manner, a voltage of one terminal of a variable resistance element of a memory cell connected to a selected data line can be immediately fixed to the predetermined second voltage independently of a resistance distribution of variable resistance elements of memory cells connected to each of the data lines, and initial leakage in reading is suppressed independently of the resistance distribution of the variable resistance elements. Since a resistance of a variable resistance element can be prevented from being written by an unexpected variation in voltage of a selected data line, disturb is suppressed, and a read margin can be expected to be improved.

The nonvolatile semiconductor memory device according to the first or second characteristic feature of the present invention preferably further includes a configuration in which a three-dimensional memory cell array in which the plurality of two-dimensional memory cell arrays are stacked in a third direction perpendicular to the first direction and the second direction is provided, the data line connects one terminals of the memory cells located at the same position in the first direction in the second and third directions, the bit line selecting circuit includes a selecting transistor array in which a plurality of selecting transistors adapted to select the bit line are arranged in the form of a two-dimensional matrix in the second direction and the third direction and adjacent to an arrangement area of the memory cells in the first direction, the bit lines located at the same position in any one of the second and third directions are connected to a common second bit line through the corresponding selecting transistors, respectively, control terminals of the selecting transistors located at the same position in the other of the second direction and the third direction are connected to a word line extending in any one of the second and third directions, and the bit line is selected by the second bit line and the word line, and the first voltage and the second voltage are supplied to the selected bit line and the non-selected bit line through the second bit line, respectively.

The nonvolatile semiconductor memory device according to the first or second characteristic feature of the present invention preferably includes a configuration in which a three-dimensional memory cell array in which the plurality of two-dimensional memory cell arrays are stacked in a third direction perpendicular to the first direction and the second direction is provided, the bit line connects other terminals of the memory cells located at the same position in the second direction in the first and third directions, the data line selecting circuit includes a selecting transistor array in which a plurality of selecting transistors adapted to select the data line are arranged in the form of a two-dimensional matrix in the first direction and the third direction and adjacent to an arrangement area of the memory cells in the second direction, the data lines located at the same position in any one of the first and third directions are connected to a common second data line through the corresponding selecting transistors, respectively, control terminals of the selecting transistors located at the same position in the other of the first and the third direction are connected to a word line extending in any one of the first and third directions, the data line is selected by the second data line and the word line, and the second voltage is supplied to the selected data line and the non-selected data line through the second data line.

With the above configuration, even in the memory cell array in which memory cells are three-dimensionally arranged, potentials of the second bit line and the data line or potentials of the bit line and the second data lines can be immediately fixed to a predetermined voltage independently of a resistance distribution of variable resistance elements of the memory cells in the array, and initial leakage in reading is suppressed independently of the resistance distribution of the variable resistance elements. Since the resistance of the variable resistance element can be prevented from being written by an unexpected variation in voltage of a bit line or a data line, disturb is suppressed, and improvement of a read margin can be expected.

Therefore, according to the present invention, a nonvolatile semiconductor device which has a suppressed leakage current and can perform stable high-speed operation can be realized.

DESCRIPTION OF THE PREFERRED EMBODIMENTS

First Embodiment

Figure 1:
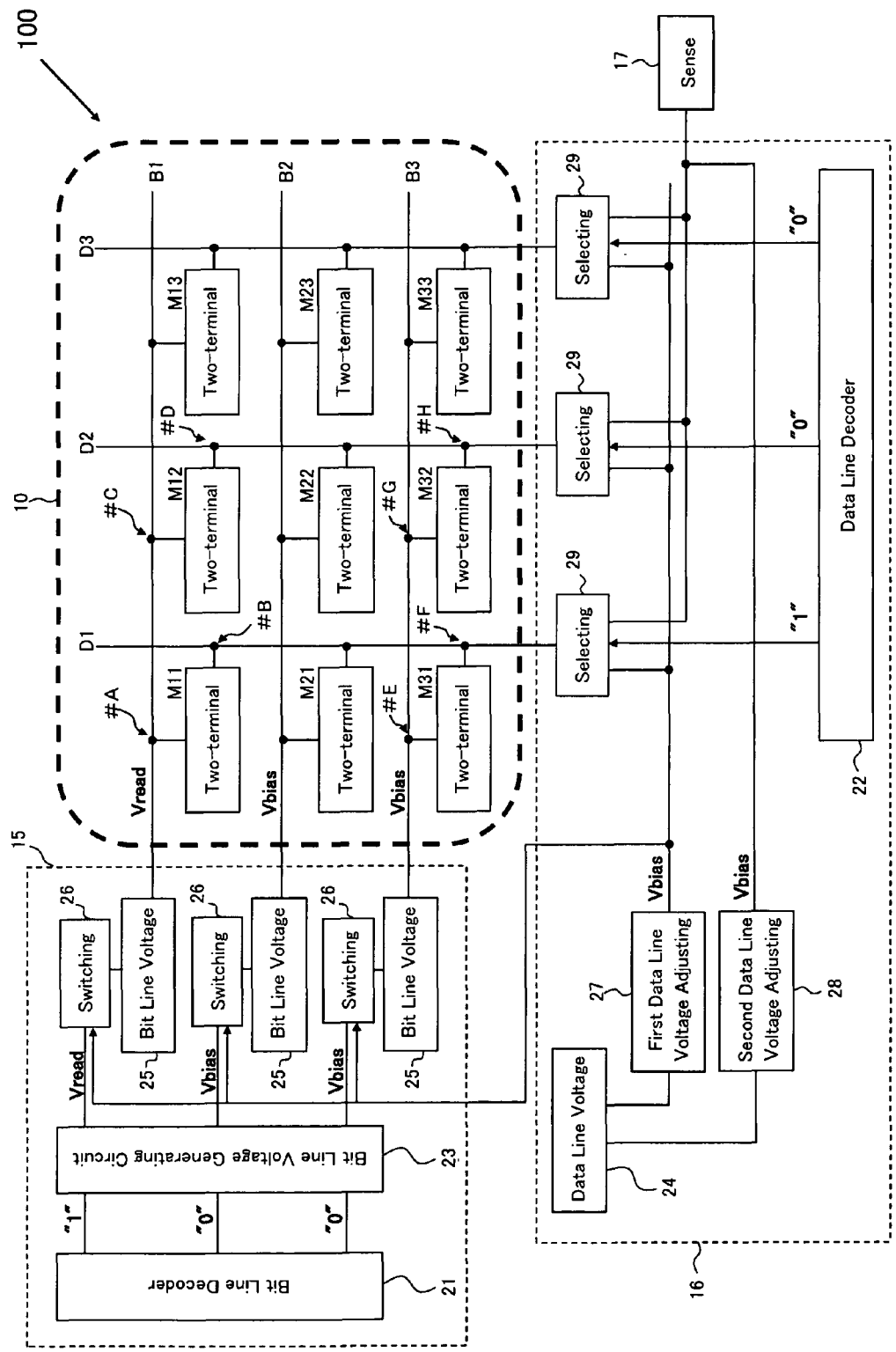
FIG. 1 is a circuit block diagram showing a schematic configuration of a nonvolatile semiconductor memory device according to the present invention.

A nonvolatile semiconductor memory device (to be arbitrarily referred to as a "present invention device 100" hereinafter) will be described below with reference to the accompanying drawings. FIG. 1 is a circuit block diagram showing a schematic configuration of the present invention device 100 according to the present invention. The present invention device 100 includes a memory cell array 10, a bit line voltage supply circuit 15, a data line voltage supply circuit 16, and a sense circuit 17. Furthermore, the bit line supply circuit 15 includes a bit line decoder 21, a bit line voltage generating circuit 23, a bit line voltage adjusting circuit 25, and a switching circuit 26. The data line supply circuit 16 includes a data line decoder 22, a data line voltage generating circuit 24, a first data line voltage adjusting circuit 27, a second data line voltage adjusting circuit 28, and a selecting circuit 29.

The memory cell array 10 is configured such that two-terminal memory cells $M_{11}$ to $M_{33}$ each having a nonvolatile variable resistance element which stores information by a change in electric resistance are arranged in the form of a matrix, one terminals of the memory cells are connected to data lines D1 to D3 extending in a second direction (vertical direction in FIG. 1), and the other terminals are connected to bit lines B1 to B3 extending in the first direction (horizontal direction in FIG. 1). As the memory cell array 10, for descriptive convenience, a 3×3 array is illustrated here. However, the present invention is not limited to the configuration. The present invention can be used in a configuration having a larger array size. The present invention is applied to a configuration having a larger array size to increase the effect of the present invention.

Figure 2A:
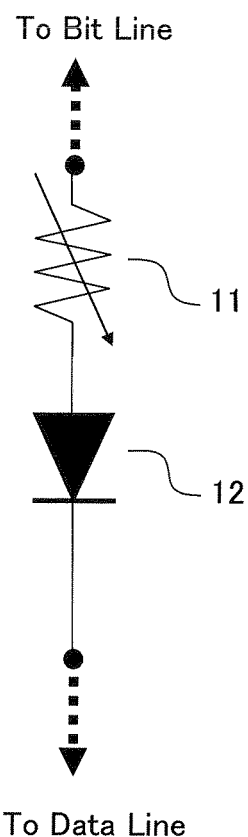
FIGS. 2A and 2B are diagrams showing a configuration of a memory cell including a variable resistance element.
Figure 2B:
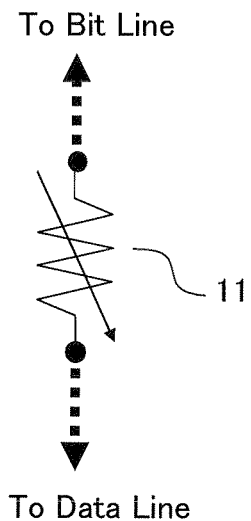

A configuration of the two-terminal memory cells $M_{11}$ to $M_{33}$ is shown in FIGS. 2A and 2B. FIG. 2A shows a configuration in which a variable resistance element 11 and a diode 12 serving as a current limiting element are connected in series with each other, and FIG. 2B shows a configuration including only the variable resistance element 11. In FIG. 2A, a nonlinear element such as a varistor and an MIM (Metal Insulator Metal) element may be used in place of the diode 12.

The bit line decoder 21 selects a memory cell subjected to a predetermined memory operation in the second direction (vertical direction in FIG. 1), a signal to be "1" with respect to a bit line (selected bit line) connected to a selected memory cell and a signal to be "0" with respect to a bit line (non-selected bit line) connected to a non-selected memory cell are output to the bit line voltage generating circuit 23 or the switching circuit 26. More specifically, the bit line decoder 21 has a role as a bit line selecting circuit which sets each of the bit lines B1 to B3 to any one of the selected bit line and the non-selected bit line. The bit line voltage generating circuit 23 receives the output signal from the bit line decoder 21, supplies a selected bit line voltage to a selected bit line having an output signal of "1" and supplies a non-selected bit line voltage to a non-selected bit line having an output signal of "0" with respect to each of the bit lines B1 to B3, and applies the voltages through the switching circuit 26 and the bit line voltage adjusting circuit 25. In reading of the selected memory cell, the bit line voltage generating circuit 23 supplies a first voltage Vread (for example, 0.5 V) and a second voltage Vbias (for example, 0 V) to the selected bit line and the non-selected bit line, respectively, with respect to each of the bit lines B1 to B3.

The bit line voltage adjusting circuit 25 is independently arranged for each of the bit lines B1 to B3. One terminals of the bit line voltage adjusting circuits 25 are connected to a bit line, and the other terminals are connected to the bit line voltage generating circuit 23 through the switching circuit 26. The bit line voltage adjusting circuit 25 has a function of immediately fixing the potentials of the bit lines B1 to B3 to the first voltage Vread supplied from the bit line voltage generating circuit 23 or the second voltage Vbias supplied from the bit line voltage generating circuit 23 or the data line voltage generating circuit 24.

Figure 3:
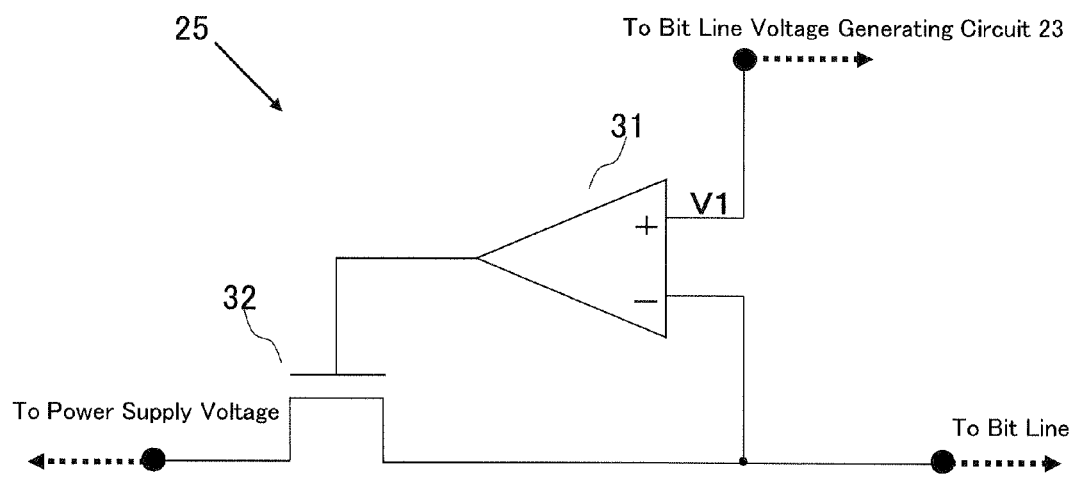
FIG. 3 is a diagram showing a circuit configuration of a bit line voltage adjusting circuit.

A circuit configuration of the bit line voltage adjusting circuit 25 is shown in FIG. 3. The bit line voltage adjusting circuit 25 includes an operational amplifier (OP Amp) 31 and a MOS transistor 32, a gate terminal of the MOS transistor 32 is connected to an output terminal of the OP Amp 31, and a drain terminal of the MOS transistor 32 is connected to an inverted input terminal of the OP Amp 31. The source terminal of the MOS transistor 32 is connected to a power supply voltage. Furthermore, the inverted input terminal of the OP Amp 31 is also connected to the bit line, and the non-inverted input terminal of the OP Amp 31 is connected to the bit line voltage generating circuit 23 through the switching circuit 26. The bit line voltage adjusting circuit 25 supplies a voltage of the inverted input terminal of the OP Amp 31 from the MOS transistor 32 to the bit line through a connection node between the drain terminal of the MOS transistor 32 and the inverted input terminal of the OP Amp 31.

With the above configuration, when a degree of amplification of the OP Amp 31 is sufficiently large, a potential of the bit line connected to the inverted input terminal of the OP Amp 31 becomes equal to a potential V1 (see FIG. 3) of the non-inverted input terminal of the OP Amp 31 by an effect of a virtual short of the OP Amp. Any one of the first voltage Vread and the second voltage Vbias is applied to the non-inverted input terminal of the OP Amp 31 through the bit line voltage generating circuit 23 and the switching circuit 26. For this reason, a potential of the bit line connected to the inverted input terminal of the OP Amp 31 is immediately fixed to the voltage Vread or Vbias and is not influenced by resistances of memory cells connected to the bit line. Therefore, since the potential of the bit line is fixed independently of a resistance distribution of variable resistance elements, a leakage current can be suppressed. Furthermore, a resistance of a variable resistance element can be prevented from being written by an unexpected variation in voltage of the bit line, disturb is suppressed, and a read margin can be expected to be improved.

Figure 4:
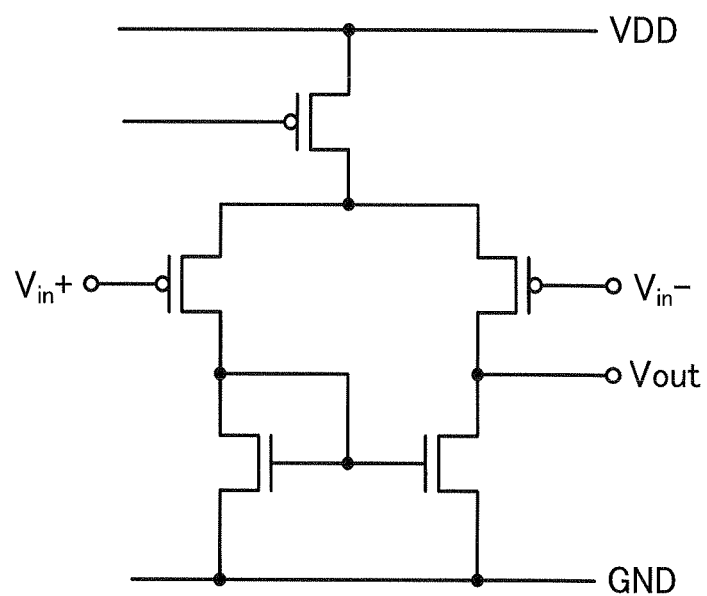
FIG. 4 is a diagram showing an example of a circuit configuration of an operational amplifier (OP Amp).

An example of a concrete circuit configuration of the OP Amp 31 is shown in FIG. 4. A voltage of a non-inverted input terminal is input to Vin+, and a voltage of an inverted input terminal to Vin−, and an amplified voltage is output to Vout. A PMOS transistor having a source terminal connected to Vdd is a transistor for controlling a current, and is used such that a gate terminal of the transistor is connected to a fixed voltage. However, the circuit configuration of the OP Amp is not limited to the configuration in FIG. 4.

The switching circuit 26 is connected to the bit line voltage generating circuit 23, the first data line voltage adjusting circuit 27 (will be described later), and the bit line voltage adjusting circuit 25. When the first voltage Vread is supplied from the bit line voltage generating circuit 23 with respect to each of the bit lines B1 to B3, the first voltage Vread is output. When the second voltage Vbias is supplied from the bit line voltage generating circuit 23, the second voltage Vbias supplied from the data line voltage generating circuit 24 through the first data line voltage adjusting circuit 27 is output and used as an input of the non-inverted input terminal of the OP Amp 31 of the bit line voltage adjusting circuit 25. A circuit configuration of the switching circuit 26 is shown in FIG. 5. The switching circuit 26 in FIG. 5 includes two MOS transistors 37 and 38 and inverters 39a and 39b (39).

Figure 5A:
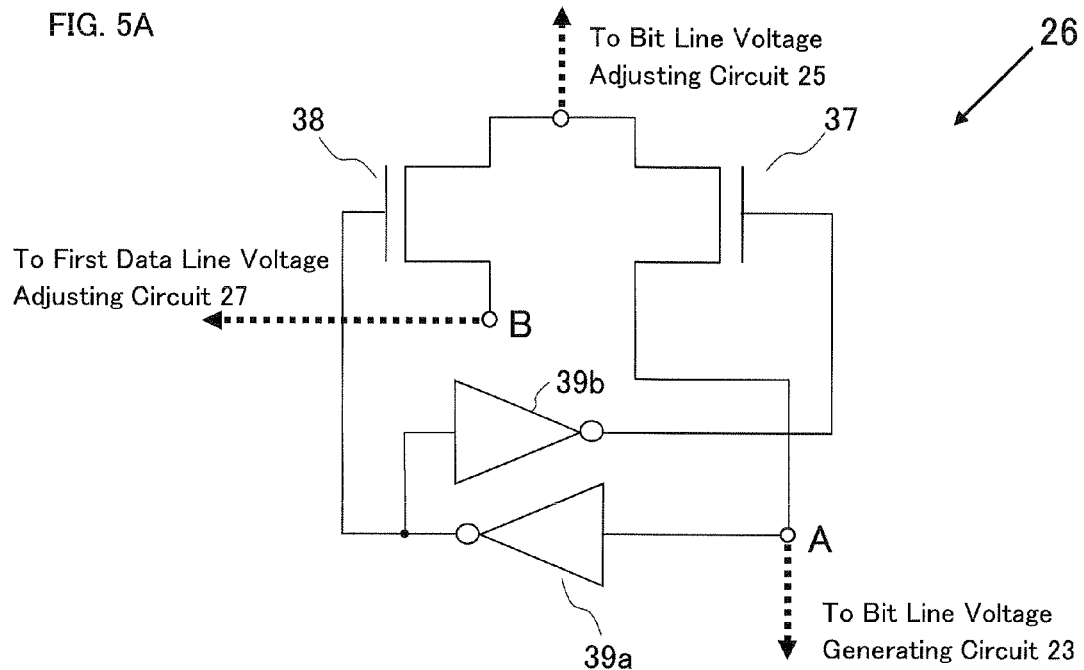
FIGS. 5A and 5B are diagrams showing a circuit configuration of a switching circuit.

FIG. 5A shows a configuration obtained when the first voltage Vread is set to be higher than the second voltage, and the second voltage Vbias from the first data line voltage adjusting circuit 27 is input to the terminal B. When the first voltage Vread higher than the second voltage Vbias is input to the terminal A, the MOS transistor 37 is turned on, the MOS transistor 38 is turned off, and a voltage of the terminal A is applied to the bit line voltage adjusting circuit 25. On the other hand, when the second voltage Vbias is input to the terminal A, the MOS transistor 37 is turned off, and the MOS transistor 38 is turned on. A voltage of the first data line voltage adjusting circuit 27 at the terminal B is applied to the bit line voltage adjusting circuit 25.

Figure 5B:
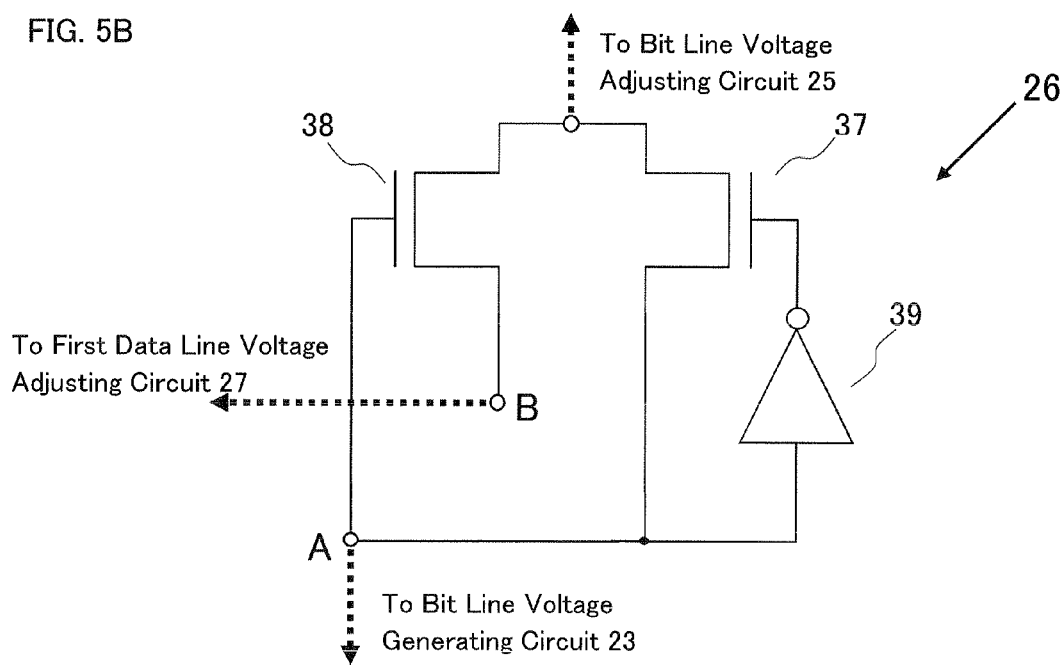

FIG. 5B shows a configuration obtained when the first voltage Vread is set to be lower than the second voltage Vbias. The second voltage Vbias from the first data line voltage adjusting circuit 27 is input to the terminal B. When the first voltage Vread lower than the second voltage Vbias is input to the terminal A, the MOS transistor 37 is turned on, the MOS transistor 38 is turned off, and the voltage of the terminal A is applied to the bit line voltage adjusting circuit 25. On the other hand, when the second voltage Vbias is input to the terminal A, the MOS transistor 37 is turned off, and the MOS transistor 38 is turned on. A voltage of the first data line voltage adjusting circuit 27 at the terminal B is applied to the bit line voltage adjusting circuit 25.

Figure 6:
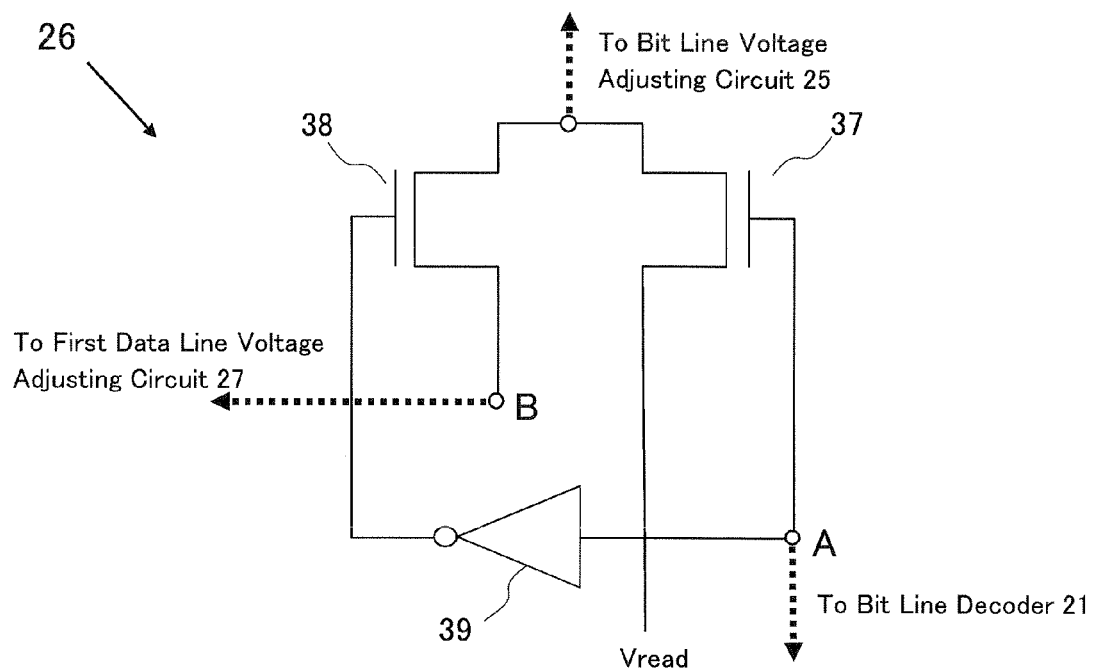
FIG. 6 is a diagram showing another circuit configuration of the switching circuit.

The switching circuit 26 preferably uses a circuit configuration in FIG. 6 in place of that in FIG. 5A. In this case, the first voltage Vread is input to one terminal of the MOS transistor 37 regardless whether the bit line is selected or non-selected. On the other hand, a signal at High or Low level is directly input from the bit line decoder 21 to the terminal A. Alternatively, any one of the first voltage Vread and the second voltage Vbias supplied from the bit line voltage generating circuit 23 may be input to one terminal of the MOS transistor 37 depending on whether the bit line is selected or not-selected.

With the above configuration, even though unexpected noise is generated in the non-selected bit line, when a memory cell is non-selected, a potential of the non-selected bit line can be reliably made equal to the same potential (second voltage Vbias) as that of the data line, and an effect of reducing a leakage current through the non-selected bit line and the non-selected data line is more improved.

The data line decoder 22 selects a memory cell to be subjected to a predetermined memory operation in a first direction (horizontal direction in FIG. 1), and outputs a signal to be "1" with respect to the data line (selected data line) connected to a selected memory cell and a signal to be "0" with respect to the data line (non-selected data line) connected to a non-selected memory cell to the selecting circuit 29 (will be described later). More specifically, the data line decoder 22 has a role as a data line selecting circuit which sets each of the data lines D1 to D3 to any one of the selected data line and the non-selected data line together with the selecting circuit 29 (will be described later). In reading for the selected memory cell, the data line voltage generating circuit 24 supplies the second voltage Vbias to both the selected data line and the non-selected data line with respect to the data lines D1 to D3.

The first data line voltage adjusting circuit 27 has one terminal connected to the first data line voltage generating circuit 24 and the other terminal connected to the selecting circuits 29 arranged for the data lines D1 to D3. The first data line voltage adjusting circuit 27 has a function of immediately fixing a potential of the non-selected data line to the second voltage Vbias supplied from the data line voltage supply circuit 24 through the selecting circuit 29.

Figure 7:
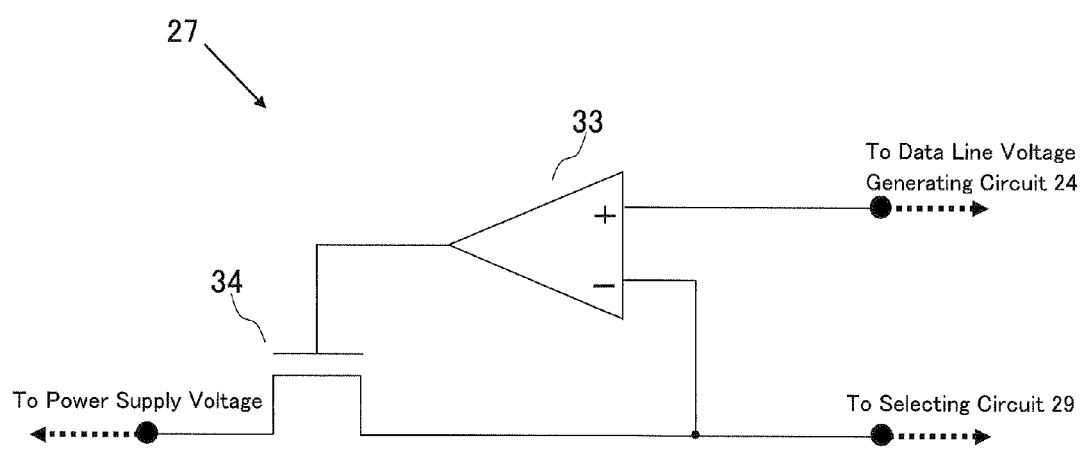
FIG. 7 is a diagram showing a circuit configuration of a first data line voltage adjusting circuit.

A circuit configuration of the first data line voltage adjusting circuit 27 is shown in FIG. 7. The first data line voltage adjusting circuit 27 includes an operational amplifier (OP Amp) 33 and a MOS transistor 34, and the gate terminal of the MOS transistor 34 is connected to an output terminal of the OP Amp 33, and the drain terminal of the MOS transistor 34 is connected to an inverted input terminal of the OP Amp 33. The source terminal of the MOS transistor 34 is connected to a power supply voltage. Furthermore, the inverted input terminal of the OP Amp 33 is connected to a data line through the selecting circuit 29, and the non-inverted input terminal of the OP Amp 33 is connected to the data line voltage generating circuit 24. The first data line voltage adjusting circuit 27 supplies a voltage of the inverted input terminal of the OP Amp 33 from the transistor 34 to the non-selected data line through a connection node between the drain terminal of the transistor 34 and the inverted input terminal of the OP Amp 33. Furthermore, a voltage of the connection node between the drain terminal of the transistor 34 and the inverted input terminal of the OP Amp 33 is also input to the switching circuit 26.

With the above configuration, when a degree of amplification of the OP Amp 33 is sufficiently large, by an effect of a virtual short of the OP Amp, a potential of a non-selected data line connected to the inverted input terminal of the OP Amp 33 is immediately fixed to a potential input to the non-inverted input terminal of the OP Amp 33, i.e., the second voltage Vbias supplied from the data line voltage generating circuit 24, and is not influenced by a resistance of a memory cell connected to the data line. Therefore, since the potential of the non-selected data line is fixed independently of a resistance distribution of variable resistance elements, a leakage current can be suppressed. Since a resistance of a variable resistance element can be prevented from being written by an unexpected variation in voltage of a non-selected data line, disturb is suppressed, and a read margin can be expected to be improved.

The second data line voltage adjusting circuit 28 has one terminal connected to the data line voltage generating circuit 24 and the other terminal connected to the selecting circuits 29 arranged for the data lines D1 to D3. The second data line voltage adjusting circuit 28 has a function of immediately fixing a potential of the selected data line to the second voltage Vbias supplied from the data line voltage supply circuit 24 through the selecting circuit 29. The second data line voltage adjusting circuit 28 fixes a voltage of a line (to be arbitrarily referred to as a "sense line" hereinafter) which connects the sense circuit 17 and the selecting circuit 29 to the second voltage Vbias.

Figure 8:
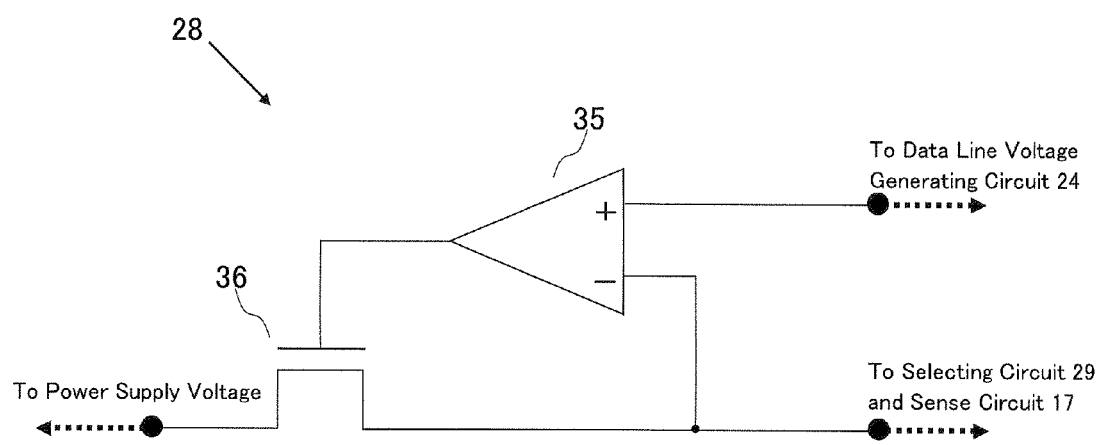
FIG. 8 is a diagram showing a circuit configuration of a second data line voltage adjusting circuit.

A circuit configuration of the second data line voltage adjusting circuit 28 is shown in FIG. 8. The second data line voltage adjusting circuit 28 includes an operational amplifier (OP Amp) 35 and a MOS transistor 36, and the gate terminal of the MOS transistor 36 is connected to an output terminal of the OP Amp 35, and the source terminal of the MOS transistor 36 is connected to an inverted input terminal of the OP Amp 35. The drain terminal of the MOS transistor 36 is connected to the power supply voltage. Furthermore, the inverted input terminal of the OP Amp 35 is connected to the sense circuit 17 and a data line through the selecting circuit 29 in parallel with each other, and the non-inverted input terminal of the OP Amp 35 is connected to the data line voltage generating circuit 24. The second data line voltage adjusting circuit 28 supplies a voltage of the inverted input terminal of the OP Amp 35 from the transistor 36 to the selected data line through a connection node between the drain terminal of the transistor 36 and the inverted input terminal of the OP Amp 35.

With the above configuration, when a degree of amplification of the OP Amp 35 is sufficiently large, by an effect of a virtual short of the OP Amp, a potential of a selected data line connected to the inverted input terminal of the OP Amp 35 is immediately fixed to a potential input to the non-inverted input terminal of the OP Amp 35, i.e., the second voltage Vbias supplied from the data line voltage generating circuit 24, and is not influenced by a resistance of a memory cell connected to the data line. Therefore, since the potential of the selected data line is fixed independently of a resistance distribution of variable resistance elements, a leakage current can be suppressed. Furthermore, since a resistance of a variable resistance element can be prevented from being written by an unexpected variation in voltage of a selected data line, disturb is suppressed, and a read margin can be expected to be improved.

The selecting circuits 29 are arranged for the data lines D1 to D3, respectively. Each of the selecting circuits 29 is connected to one of the data lines, the first data line voltage adjusting circuit 27, and the second data line voltage adjusting circuit 28. The selecting circuit 29 supplies the second voltage Vbias supplied from the data line voltage generating circuit 24 through the first data line voltage adjusting circuit 27 to the data line when the data line connected to the selecting circuit 29 is a non-selected data line, and supplies the second voltage Vbias supplied from the data line voltage generating circuit 24 through the second data line voltage adjusting circuit 28 to the data line when the data line connected to the selecting circuit 29 is a selected data line. It is determined by an output signal from the data line decoder 22 whether a circuit through which the second voltage Vbias is supplied to the data line is the first data line voltage adjusting circuit 27 or the second data line voltage adjusting circuit 28, i.e., whether each of the data lines corresponds to the non-selected data line or the selected data line.

Figure 9:
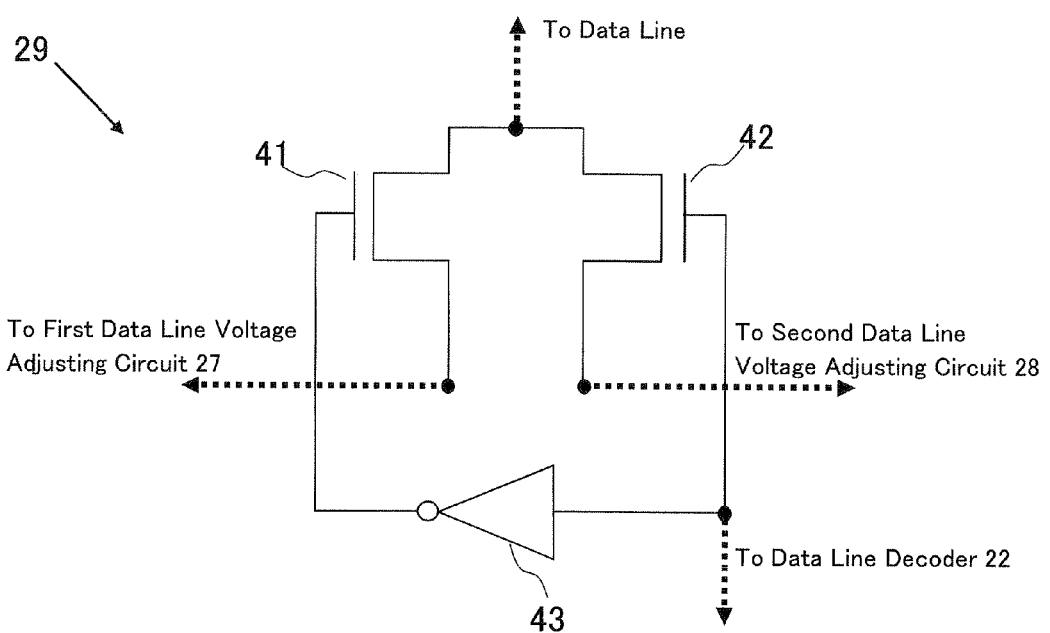
FIG. 9 is a diagram showing a circuit configuration of a selecting circuit.

A circuit configuration of the selecting circuit 29 is shown in FIG. 9. The selecting circuit 29 is a switch including transistors 41 and 42 and an inverter 43. The selecting circuit 29 switches a destination to which a data line is connected to any one of the first data line voltage adjusting circuit 27 and the second data line voltage adjusting circuit 28 depending on a signal from the data line decoder 22. In the example, shown in FIG. 9, when reading is selected, the transistor 42 is turned on by receiving a High ("1") signal from the data line decoder 22, and the data line is connected to the second data line voltage adjusting circuit 28. On the other hand, when reading is not selected, the transistor 41 is turned on by receiving a Low ("0") signal, and the data line is connected to the first data line voltage adjusting circuit 27. In any case, by the operation of the first data line voltage adjusting circuit 27 or the second data line voltage adjusting circuit 28, the potential of the data lie is fixed to the predetermined second voltage Vbias.

The sense circuit 17 is connected on a line which connects the second data line voltage adjusting circuit 28 to each of the selecting circuits 29. In reading, the sense circuit 17 detects a current flowing in the selected data line separately from a current flowing in the non-selected data line to detect an electric resistance state of the selected memory cell. In the embodiment, the sense circuit 17 is supposed to be a current sense circuit which determines a magnitude of a current.

An outline of a reading operation of a selected memory cell in the present invention device 100 will be described below with reference to a case in which a memory cell $M_{11}$ located on the upper left of the memory cell array 10 is selected in FIG. 1.

The first voltage Vread is applied from the bit line voltage generating circuit 23 to the bit line voltage adjusting circuit 25 connected to the bit line B1 selected by the bit line decoder 21, and the second voltage Vbias from the data line voltage generating circuit 24 is applied to the bit line voltage adjusting circuit 25 connected to the non-selected bit line B2 or B3 through the switching circuit 26.

By the operation of the bit line voltage adjusting circuit 25, independently of a resistance distribution of variable resistance elements of memory cells connected to bit lines, the selected bit line B1 is immediately fixed to the first voltage Vread, and the non-selected bit lines B2 and B3 are immediately fixed to the second voltage Vbias.

On the other hand, the selecting circuit 29 connected to a data line D1 selected by the data line decoder 22 connects the selected data line to the second data line voltage adjusting circuit 28 and the sense circuit 17, and the selecting circuit 29 connected to the non-selected data line D2 or D3 connects the non-selected data line to the first data line voltage adjusting circuit 27.

The second voltage Vbias is supplied from the data line voltage generating circuit 24 to the first data line voltage adjusting circuit 27 and the second data line voltage adjusting circuit 28. In this manner, the selected data line and the non-selected data line are immediately fixed to the voltage Vbias independently of a resistance distribution of variable resistance elements of memory cells connected to each of the data lines.

Considering potentials at both the terminals of the selected memory cell $M_{11}$, a potential of node #A on a selected bit line B1 side is fixed to the voltage Vread by the bit line voltage adjusting circuit 25, and a potential of a node #B on a selected data line D1 side is fixed to the voltage Vbias by the second data line voltage adjusting circuit 28.

Similarly, considering potentials at both the terminals of a half-selected memory cell $M_{12}$ connected to the selected bit line B1 and the non-selected data line D2, a potential of a node #C on the selected bit line B1 side is fixed to the voltage Vread by the bit line voltage adjusting circuit 25, and a potential of a node #D on a non-selected data line D2 side is fixed to the voltage Vbias by the first data line voltage adjusting circuit 27.

Similarly, considering potentials at both the terminals of a half-selected memory cell $M_{31}$ connected to the non-selected bit line B3 and the selected data line D1, a potential of a node #E on the non-selected bit line B3 side is fixed to the voltage Vbias by the bit line voltage adjusting circuit 25, and a potential of a node #F on a selected data line D1 side is fixed to the voltage Vbias by the second data line voltage adjusting circuit 28.

Similarly, considering potentials at both the terminals of a non-selected memory cell $M_{32}$ connected to the non-selected bit line B3 and the non-selected data line D2, a potential of a node #G on the non-selected bit line B3 side is fixed to the voltage Vbias by the bit line voltage adjusting circuit 25, and a potential of a node #H on the non-selected data line D2 side is fixed to the voltage Vbias by the first data line voltage adjusting circuit 27.

When line resistances of the data line and the bit line are sufficiently smaller than a resistance of a memory cell in a low resistance state, the potentials at the nodes #A to #H are accurately held at a level of a voltage applied to the non-inverted input terminal of each of the voltage adjusting circuits. In this manner, a leakage current generated in reading can be considerably suppressed.

Furthermore, the potentials at the nodes #A to #H depend only on a level of a voltage applied to a non-inverted input terminal of each of the voltage adjusting circuit and are fixed to a predetermined constant voltage. For this reason, the potentials do not depend on the resistance distribution of the variable resistance elements of the memory cells in the memory cell array 10. Therefore, even though the memory cells in the memory cell array 10 have any resistance distribution, a mechanism which can minimize initial leakage is obtained.

As a result, although the voltage (Vread-Vbias) is applied to the selected memory cell $M_{11}$ independently of a resistance state of the memory cell $M_{11}$, since the potential of the non-selected bit line, the potential of the selected data line, and the potential of the non-selected data line are fixed to the same potential, a leakage current is not generated through the half-selected memory cell $M_{21}$ or $M_{31}$ connected to the non-selected bit line and the selected data line. When a resistance of a memory cell is represented by R, a current given by (Vread-Vbias)/R flows in the selected memory cell $M_{11}$, and only the current is detected by the sense circuit 17 through a selected data line D1, the selecting circuit 29 and sense line to make it possible to read whether the resistance state of the memory cell $M_{11}$ is a high resistance state or a low resistance state.

Even though only the bit line voltage adjusting circuit or only the first data line voltage adjusting circuit is arranged, a leak current is reduced, and the effect of the present invention is obtained. However, as described in the above embodiment, when all the voltage adjusting circuits are arranged, a leakage current can be more effectively reduced.

Second Embodiment

Figure 10:
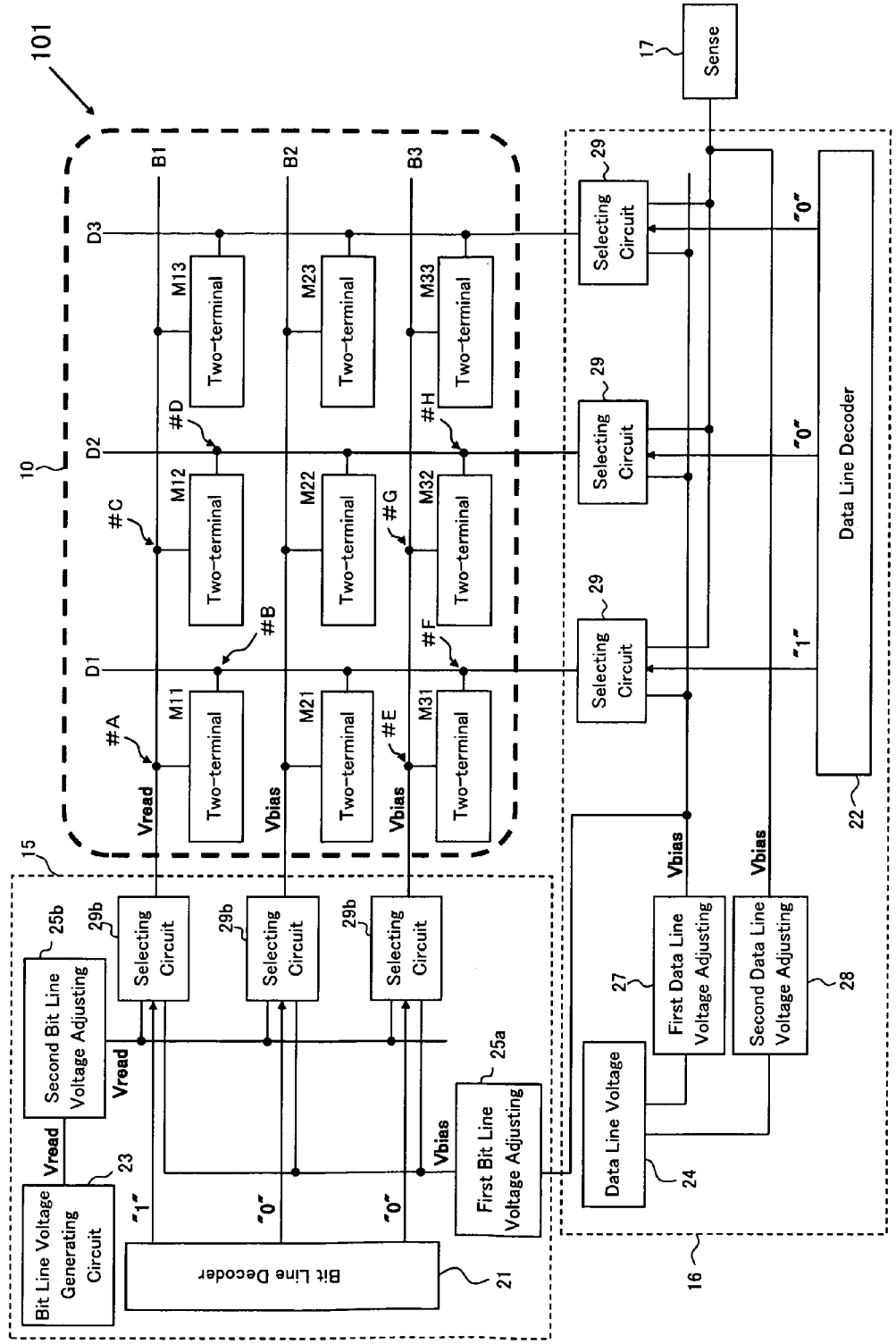
FIG. 10 is a circuit block diagram showing a schematic configuration of a nonvolatile semiconductor memory device according to a second embodiment of the present invention.

The first embodiment described above explains the configuration in which the bit line voltage adjusting circuits are arranged for the bit lines, respectively, and a voltage supplied to each of the bit lines is fixed to any one of the first voltage and the second voltage. However, the present invention is not limited to the configuration. FIG. 10 is a circuit block diagram showing a schematic configuration of a nonvolatile semiconductor memory device (to be arbitrarily referred to as a "present invention device 101" hereinafter) according to an embodiment of the present invention. The present invention device 101 includes a selecting circuit 29*b* for each of bit lines. Based on a signal from the bit line decoder 21, a voltage supplied to each of the bit lines through the selecting circuit 29*b* is switched to the first voltage Vread when the bit line is a selected bit line, and is switched to the second voltage Vbias when the bit line is a non-selected bit line. In other words, the present invention device 101 is obtained such that a circuit configuration of the data line voltage supply circuit 16 on the data line side in the present invention device 100 is also employed for a circuit configuration of the bit line voltage supply circuit 15 on the bit line side.

The bit line voltage supply circuit 15 includes the bit line decoder 21, the bit line voltage generating circuit 23, a first bit line voltage adjusting circuit 25*a*, a second bit line voltage adjusting circuit 25*b*, and a selecting circuit 29*b*.

The bit line decoder 21 selects a memory cell subjected to a predetermined memory operation in the second direction (vertical direction in FIG. 10), a signal to be "1" with respect to a bit line (selected bit line) connected to a selected memory cell and a signal to be "0" with respect to a bit line (non-selected bit line) connected to a non-selected memory cell are output to the selecting circuit 29*b*. More specifically, the bit line decoder 21 has a role as a bit line selecting circuit which sets each of the bit lines B1 to B3 to any one of the selected bit line and the non-selected bit line together with the selecting circuit 29*b*.

In reading of the selected memory cell, the bit line voltage generating circuit 23 supplies the first voltage Vread (for example, 0.5 V) and a second voltage Vbias (for example, 0 V) to the selected bit line and the non-selected bit line, respectively, with respect to each of the bit lines B1 to B3. In this case, a voltage which is generated by the data line voltage generating circuit 24 and fixed through the first data line voltage adjusting circuit 27 can be used for the second voltage Vbias supplied to the non-selected bit line. For this reason, the bit line voltage generating circuit 23 may only supply the first voltage Vread to be supplied to the selected bit line.

The first bit line voltage adjusting circuit 25*a* has one terminal connected to the first data line voltage adjusting circuit 27 and the other terminal connected to the selecting circuits 29*b* arranged for the bit lines B1 to B3. A circuit configuration of the first bit line voltage adjusting circuit 25*a* is the same as that in FIG. 3 in the first embodiment. In the first bit line voltage adjusting circuit 25*a*, in FIG. 3, the inverted input terminal of the OP Amp 31 is connected to the bit line through the selecting circuit 29*b*, and the non-inverted input terminal of the OP Amp 31 is connected to the inverted input terminal of the OP Amp 33 of the first data line voltage adjusting circuit 27 (see FIG. 7).

With the above configuration, when a degree of amplification of the OP Amp 31 is sufficiently large, by an effect of a virtual short of the OP Amp, a potential of a non-selected bit line connected to the inverted input terminal of the OP Amp 31 through the selecting circuit 29*b* is immediately fixed to a potential input to the non-inverted input terminal of the OP Amp 31, i.e., the second voltage Vbias, and is not influenced by a resistance of a memory cell connected to the bit line. Therefore, since the potential of the non-selected bit line is fixed independently of a resistance distribution of variable resistance elements, a leakage current can be suppressed. Since a resistance of a variable resistance element can be prevented from being written by an unexpected variation in voltage of a non-selected bit line, disturb is suppressed, and a read margin can be expected to be improved.

Furthermore, when a voltage of the inverted input terminal of the OP Amp 33 of the first data line voltage adjusting circuit 27 is input to the non-inverted input terminal of the OP Amp 31, even though unexpected noise is generated at the non-selected bit line, a potential of the non-selected bit line can be reliably made equal to the same potential (second voltage Vbias) as that of the data line, and a leakage current through the non-selected bit line and the non-selected data line can be suppressed from increasing.

The second bit line voltage adjusting circuit 25*b* has one terminal connected to the bit line voltage generating circuit 23 and the other terminal connected to the selecting circuits 29*b* arranged for the bit lines B1 to B3. A circuit configuration of the second bit line voltage adjusting circuit 25*b* is the same as that in FIG. 3 in the first embodiment. In the second bit line voltage adjusting circuit 25*b*, in FIG. 3, the inverted input terminal of the OP Amp 31 is connected to the bit line through the selecting circuit 29*b*. The second bit line voltage adjusting circuit 25*b* immediately fixes the potential of the selected bit line to the first voltage Vread serving as a voltage of the non-inverted input terminal of the OP Amp 31 through the selecting circuit 29*b* by an effect of a virtual short of the OP Amp. As a result, since the potential of the selected bit line is fixed to the resistance distribution of the variable resistance elements, a leakage current can be suppressed. Furthermore, a resistance of a variable resistance element can be prevented from being written by an unexpected variation in voltage of the selected bit line, disturb is suppressed, and a read margin can be expected to be improved.

The selecting circuits 29*b* are arranged for the bit lines B1 to B3, respectively. Each of the selecting circuits 29*b* is connected to one of the bit lines, the first bit line voltage adjusting circuit 25*a*, and the second bit line voltage adjusting circuit 25*b*. The selecting circuit 29*b* receives a signal from the bit line decoder 21. When a bit line connected to the selecting circuit 29*b* is a non-selected bit line, the selecting circuit 29*b* supplies the second voltage Vbias through the first bit line voltage adjusting circuit 25*a* to the bit line. When the bit line connected to the selecting circuit 29*b* is a selected bit line, the selecting circuit 29*b* supplies the first voltage Vread supplied from the bit line voltage generating circuit 23 through the second bit line voltage adjusting circuit 25*b* to the bit line. It is determined by an output from the bit line decoder 21 whether a voltage supplied to the bit line is the second voltage Vbias through the first bit line voltage adjusting circuit 25*a* or the first voltage Vread through the second bit line voltage adjusting circuit 25*b*, i.e., whether each of the bit lines corresponds to a non-selected bit line or a selected bit line.

The data line voltage supply circuit 16 includes a data line decoder 22, a data line voltage generating circuit 24, a first data line voltage adjusting circuit 27, a second data line voltage adjusting circuit 28, and a selecting circuit 29. Since configurations of the circuits in the data line voltage supply circuit 16, the sense circuit 17, and the memory cell array 10 are the same as those in the present invention device 100 in the first embodiment, a description thereof will be omitted.

Third Embodiment

Figure 11:
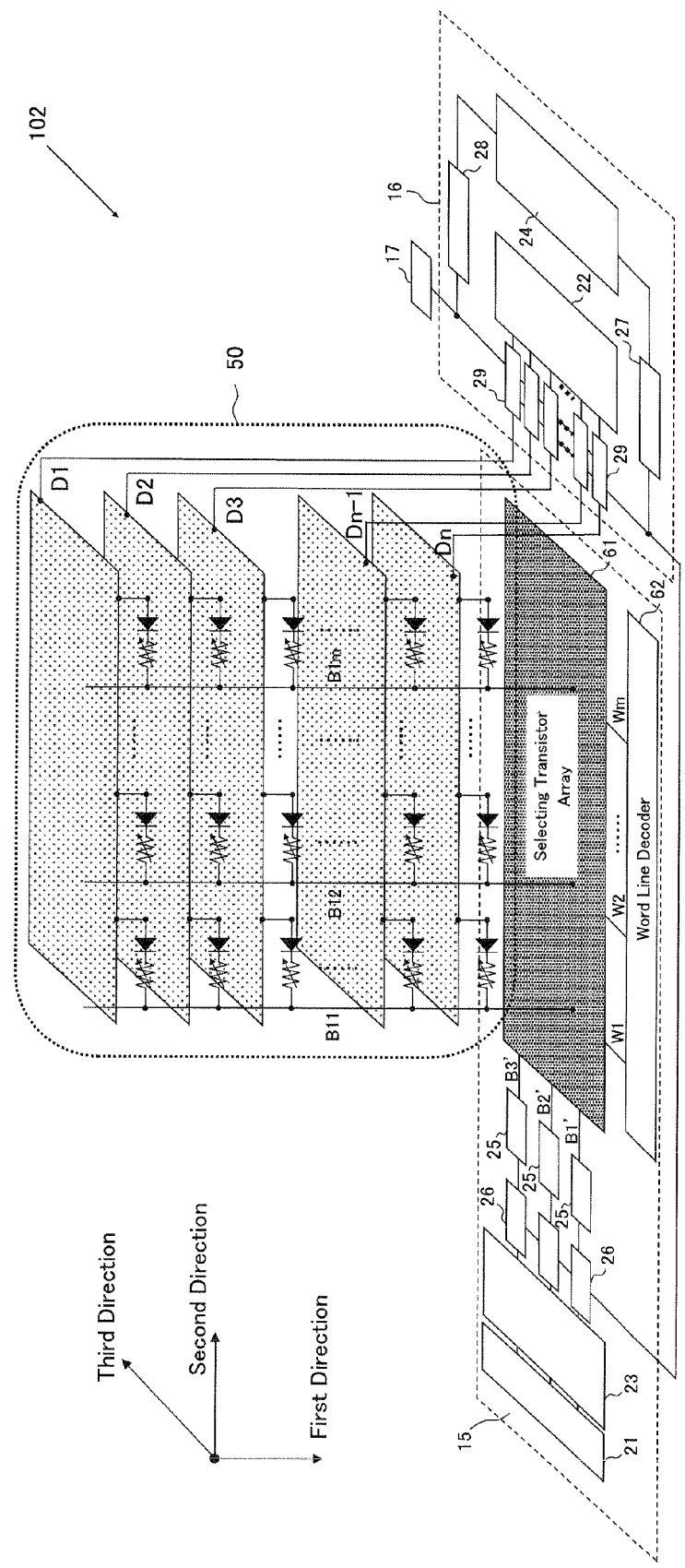
FIG. 11 is a circuit block diagram showing a schematic configuration of a nonvolatile semiconductor memory device according to a third embodiment of the present invention.

In the following description, a nonvolatile semiconductor memory device (to be arbitrarily referred to as a "present invention device 102") according to an embodiment of the present invention will be described below with reference to the accompanying drawings. FIG. 11 is a circuit block diagram showing a schematic configuration of the present invention device 102. The present invention device 102 includes a memory cell array 50 in which memory cells which are two-dimensionally arranged in the present invention device 100 are further three-dimensionally arranged.

The memory cell array 50 is a memory cell array in which the plurality of memory cell arrays 10 in the first embodiment each obtained by arranging two-terminal memory cells each configured by a nonvolatile variable resistance element and a diode in the form of a matrix in the first direction (vertical direction in FIG. 11) and the second direction (horizontal direction in FIG. 11) are further arranged to be stacked in the third direction (depth direction in FIG. 11). One terminals (diode side) of the memory cells are connected to flat-plate-shaped data lines D1 to Dn parallel to the second and third directions and perpendicular to the first direction, and the other terminals (variable resistance element side) are connected to bit lines B11 to B3$m$ extending in the first direction. For this reason, one terminals of memory cells located at the same position in the first direction are connected to each other in the second direction and the third direction and connected to the same flat-plate-shaped data line. The data line is connected to the first data line voltage adjusting circuit 27, the second data line voltage adjusting circuit 28, and the data line decoder 22 through the selecting circuit 29.

In FIG. 11, in order to prevent the drawing from being complicated, of the two-dimensional memory cell arrays 10 consisting of a plurality of layers (in this case, three layers), only the front memory cell array 10 is shown, and the memory cell arrays behind the front memory cell array 10 are not shown.

Figure 12:
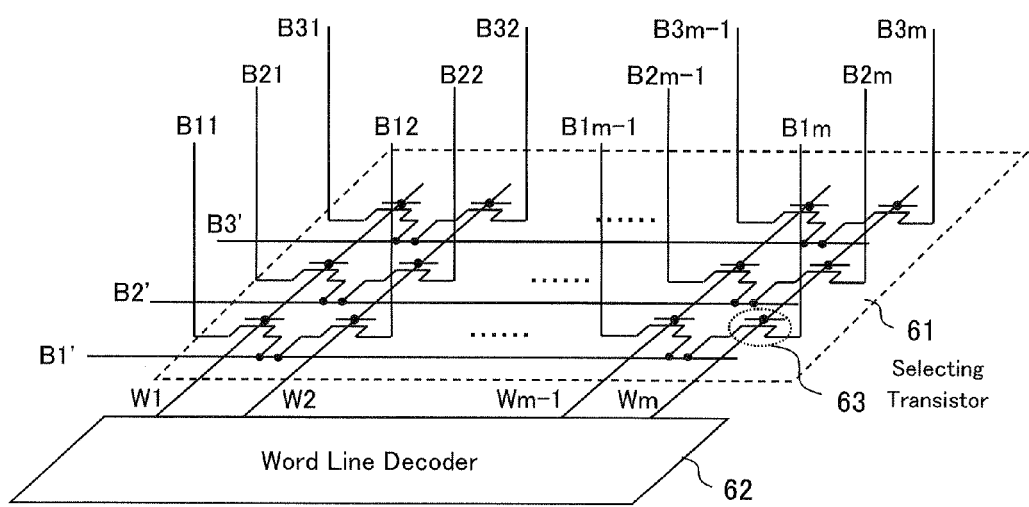
FIG. 12 is a diagram showing a circuit configuration of a selecting transistor array.

The bit lines extending in the first direction are connected to selecting transistors in a selecting transistor array 61 arranged adjacent to an arrangement area of the memory cells in the first direction, respectively, and connected to second bit lines B1' to B3' through the selecting transistors, respectively. A circuit configuration of a selecting transistor array is shown in FIG. 12.

In the selecting transistor array 61, a plurality (m×n in FIG. 12) of transistors 63 are arranged on a two-dimensional matrix in the second direction and the third direction, and the source terminals of the transistors 63 are independently connected to the bit lines B11 to B3$m$ extending in the first direction, respectively. The drain terminals of the transistors 63 located at the same position in the third direction are connected to the common second bit lines B1' to B3' extending in the second direction. In other words, the bit lines B11 to B3$m$ are independently connected to the second bit lines B1' to B3' through the transistors on the corresponding selecting transistor array 61, respectively, and assembled to any one of the second bit lines B1' to B3' in which the position in the third direction extends in the second direction for each of the same bit lines. The second bit lines B1' to B3' are connected to the bit line decoder 21 through the bit line voltage adjusting circuit 25, the switching circuit 26, and the bit line voltage generating circuit 23. On the other hand, of the transistors 63, gate terminals of the transistors located at the same positions in the second direction are connected to word lines W1 to Wm extending in the third direction, respectively. The word lines W1 to Wm are connected to a word line decoder 62. More specifically, the present invention device 102 has a configuration in which a bit line is selected by the word lines W1 to Wm and the second bit lines Br to B3', and the selecting transistor array 61 and the word line decoder 62 have a role as a bit line selecting circuit which sets each of the bit lines B11 to B3$m$ to a selected bit line or a non-selected bit line together with the bit line decoder 21.

In the present invention device 102, the data line decoder 22 selects a position in the first direction of memory cells to be operated in the three-dimensional memory cell array 50, the word line decoder 62 selects a position in the second direction, the bit line decoder 21 selects a position in the third direction to apply the first voltage Vread (for example, 0 V) to a selected bit line through the second bit line, to apply the second voltage Vbias (for example, 0.5 V) to a non-selected bit line through the second bit line, and to apply the second voltage Vbias to the selected or non-selected data line so that reading from the selected memory cell can be performed.

Since concrete configurations of the bit line decoder 21, the data line decoder 22, the bit line voltage generating circuit 23, the data line voltage generating circuit 24, the bit line voltage adjusting circuit 25, the switching circuit 26, the first data line voltage adjusting circuit 27, the second data line voltage adjusting circuit 28, the selecting circuit 29, and the sense circuit 17 are the same as those in the first embodiment, a description thereof will be omitted.

Figure 13:
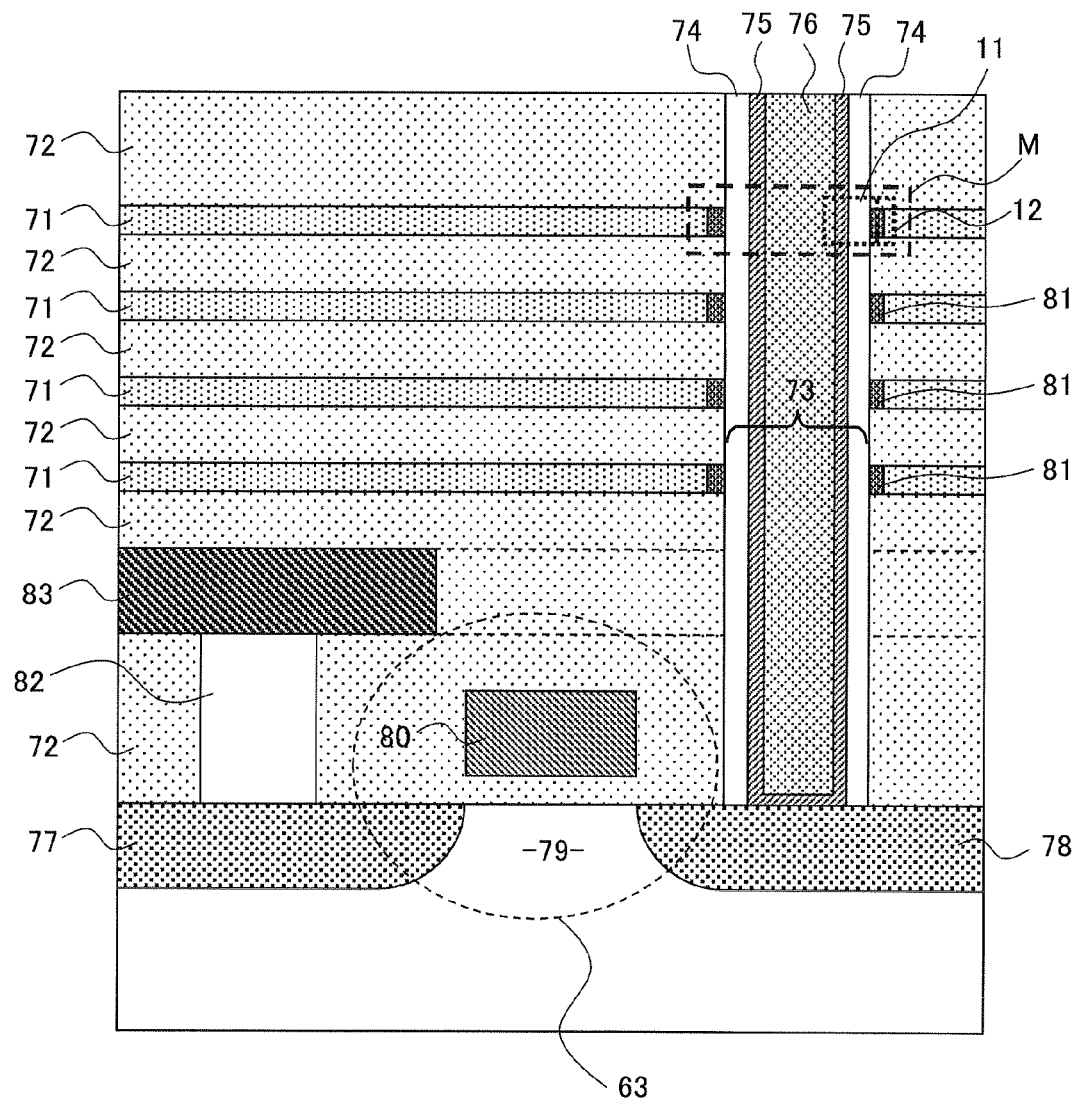
FIG. 13 is a sectional structure diagram showing a configuration of a three-dimensional memory cell array.

In the memory cell array 50, after a multi-layered structure including an insulating interlayer and a plate electrode layer serving as a data line is formed, a plurality of holes passing through the multi-layered structure are formed, and a variable resistor film and an electrode for a variable resistance element are deposited on an inner wall of each of the hole. Thereafter, each of the holes are filled with a metal material serving as a bit line. FIG. 13 shows an example of a sectional structure of the memory cell array 50. FIG. 13 shows an example of the memory cell array 50 in which plate electrodes serving as data lines are laminated as four layers, and is a sectional structure diagram on a plane perpendicular to the third direction in FIG. 11.

On a substrate, four plate electrodes 71 formed by, for example, p-type polycrystalline silicon films are separately laminated in the first direction through insulating interlayers 72. A plurality of through holes 73 passing through the laminate film and each having a depth reaching the substrate are formed. The through holes 73 have internal walls covered with a variable resistor 74 and a first electrode 75 and are filled with a metal film 76 serving as a bit line.

An n-type impurity is diffused from the through hole 73 into an end portion of the plate electrode 71 on the variable resistor 74 side to form an n-type area 81. In this manner, the diode 12 constituted by a p-n junction is formed on the end portion of the plate electrode 71 on the variable resistor 74 side. The plate electrode 71 configures a cathode electrode of the diode 12 on an end portion being in contact with the n-type area and also serves as a second electrode of a variable resistance element. Although a metal oxide film constituting the variable resistor 74 is continuously formed in the first direction, the metal oxide film is in a high resistance state before an initializing process. Since a portion facing the insulating interlayer 72 is not initialized, the plurality of variable resistance elements 11 are separately formed in the first direction. As a result, a plurality of memory cells M each constituted by the variable resistance element 11 and the diode 12 are separately formed in the first direction.

On the substrate, the transistors 63 each having a drain area 77, a source area 78, a channel area 79, and a gate electrode 80 are arranged in the form of a two-dimensional matrix to form a selecting transistor array 62, and the source areas 78 of the transistors 63 are independently connected to the first electrode 75 and a metal layer (bit line) 76 which fill the through holes 73, respectively. The drain diffusion areas 77 of the transistors 63 are connected to second bit lines 83 extending in the second direction through holes 82, respectively. The gate electrodes 80 of the transistors 63 located at the same position in the second direction are connected to each other and are connected to the word line decoder 62 as word lines extending in the third direction.

In the present invention device 102, each of the memory cells has a diode connected to a data line to reduce a leakage current flowing through a selected data line and a non-selected data line, and, by the operations of the bit line voltage adjusting circuit 25, the first data line voltage adjusting circuit 27, the second data line voltage adjusting circuit 28, and the switching circuit 26, voltages applied to a bit line and a data line are immediately fixed to a predetermined potential independently of a resistance distribution of the variable resistance elements. For this reason, a leakage current can be more effectively suppressed. Furthermore, since a resistance of a variable resistance element can be prevented from being written by unexpected variations in voltage of a data line and a bit line, disturb is suppressed, and a read margin can be expected to be improved, and a large capacity memory can be achieved.

Fourth Embodiment

Figure 14:
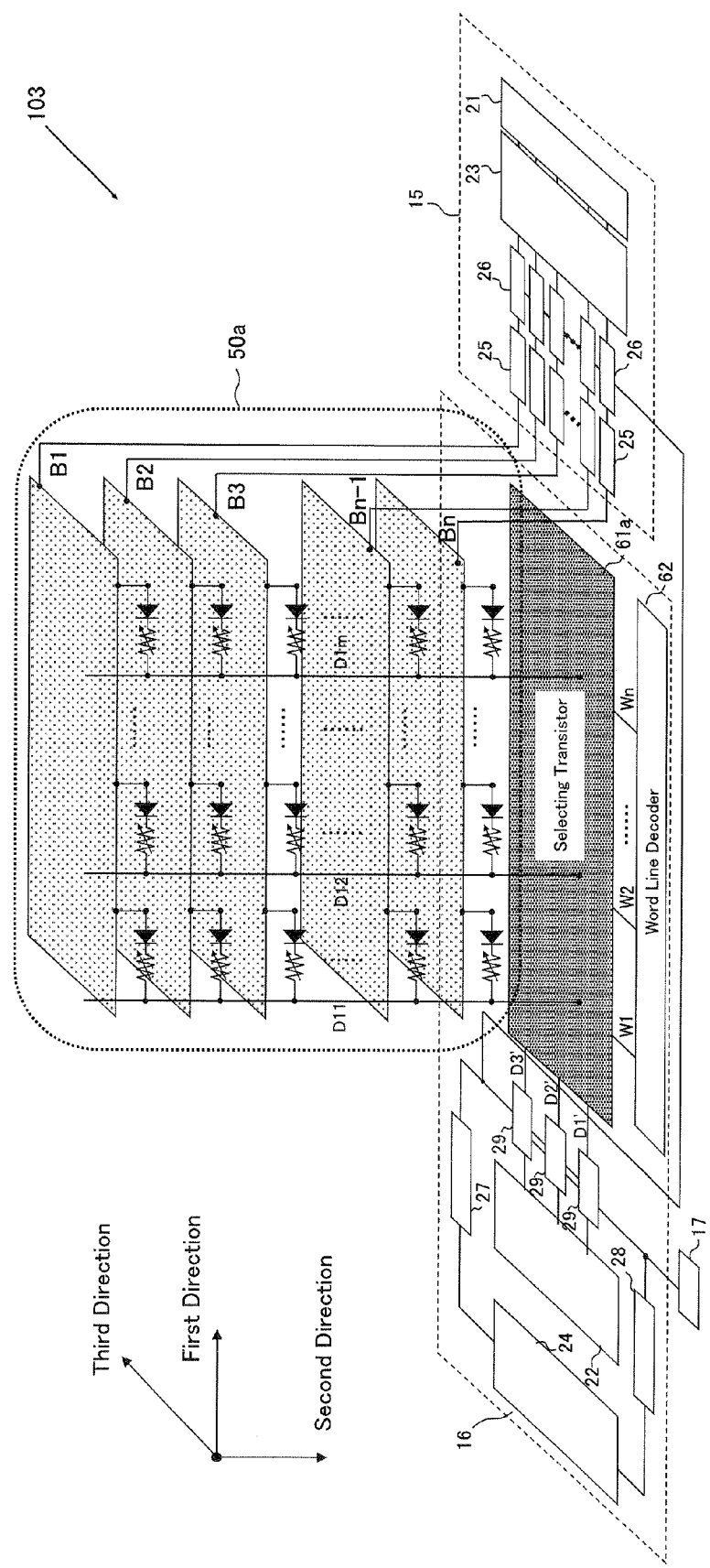
FIG. 14 is a circuit block diagram showing a schematic configuration of a nonvolatile semiconductor memory device according to a fourth embodiment of the present invention.

The third embodiment explains the configuration in which a data line is flat-plate-shaped, a bit line is a one-dimensional line, and a first voltage for reading is applied from a bit line side to perform reading. However, the present invention is not limited to the configuration. A configuration in which a bit line is flat-plate-shaped, a data line is a one-dimensional line, and a first voltage for reading is applied from a flat-plate-shaped bit line side to perform reading may also be used. A circuit block diagram showing a schematic configuration in the above case is shown in FIG. 14.

In a nonvolatile semiconductor device 103 (to be arbitrarily referred to as a "present invention device 103" hereinafter) shown in FIG. 14, a three-dimensional memory cell array 50*a* is obtained such that one terminals (variable resistance element side) of the memory cells are connected to data lines D11 to D3*m* extending in the second direction (vertical direction in FIG. 14), the other terminals of the memory cells are connected to flat-plate-shaped bit lines B1 to Bn which are parallel to the first direction (horizontal direction in FIG. 14) and the third direction (depth direction in FIG. 14) and perpendicular to the second direction. For this reason, the other terminals of memory cells located at the same position in the second direction are connected to each other in the first direction and the third direction and connected to the same flat-plate-shaped bit line. In FIG. 14, as in FIG. 11, in order to prevent the drawing from being complicated, of the two-dimensional memory cell arrays 10 consisting of a plurality of layers (in this case, three layers), only the front memory cell array 10 is shown, and the memory cell arrays behind the front memory cell array 10 are not shown.

The data lines D11 to D3*m* extending in the second direction are connected to selecting transistors 63 in a selecting transistor array 61*a* arranged adjacent to an arrangement area of the memory cells in the second direction, respectively, and connected to second data lines Dr to D3' through the selecting transistors, respectively. Of the transistors 63, gate terminals of the transistors located at the same positions in the first direction are connected to word lines W1 to Wm extending in the third direction, respectively, and the word lines are connected to the word line decoder 62.

In the selecting transistor array 61, although the plurality (m×n) of transistors 63 are arranged on a two-dimensional matrix in the first direction and the third direction, a concrete circuit configuration is the same as that in FIG. 12. For this reason, a description of the circuit configuration will be omitted. In FIG. 12, the bit lines B11 to B3*m* may be considered as the data lines D11 to D3*m*, and the second bit lines B1' to B3' may be considered as the second data lines D1' to D3'.

The present invention device 103 has a configuration in which the data lines D11 to D3*m* are selected by the word lines W1 to Wm and the second data lines D1' to D3', and the selecting transistor array 61*a* and the word line decoder 62 has a role as a data line selecting circuit which sets each of the data lines D11 to D3*m* to a selected data line or a non-selected data line together with the data line decoder 22 and the selecting circuit 29. In the present invention device 103, the word line decoder 62 selects a position in the first direction of memory cells to be operated in the three-dimensional memory cell array 50*a*, the bit line decoder 21 selects a position in the second direction, the data line decoder 22 selects a position in the third direction to apply the first voltage Vread (for example, 0.5 V) to a selected bit line, to apply the second voltage Vbias (for example, 0 V) to a non-selected bit line, and to apply the second voltage Vbias to the selected or non-selected data line through the second data line so that reading from the selected memory cell can be performed.

In the present invention device 103, each of the memory cells has a diode connected to a bit line to reduce a leakage current flowing through a selected data bit and a non-selected bit line, and, by the operations of the bit line voltage adjusting circuit 25, the first data line voltage adjusting circuit 27, the second data line voltage adjusting circuit 28, and the switching circuit 26, voltages applied to a bit line and a data line are immediately fixed to a predetermined potential independently of a resistance distribution of the variable resistance elements. For this reason, a leakage current can be more effectively suppressed. Furthermore, since a resistance of a variable resistance element can be prevented from being written by unexpected variations in voltage of a data line and a bit line, disturb is suppressed, and a read margin can be expected to be improved, and a large capacity memory can be achieved.

The above embodiment is an example of preferred embodiments of the present invention. The embodiments of the present invention are not limited to the above embodiments, and various modifications can be effected without departing from the spirit and scope of the invention.

Other embodiments will be described below.

(1) In the above embodiments, the plurality of sense circuits 17 may be arranged. In this case, the sense circuits 17 are connected to different selected bit lines, respectively, so that data can be simultaneously read from the plurality of selected memory cells. In this case, the second data line voltage adjusting circuits 28 the number of which is at least the same number of selected data lines are arranged, connected to the inputs of the sense circuits 17, respectively, and independently connected to the selected data lines through the selecting circuits 29, so that reading can be performed in a state in which potentials of the selected data lines are fixed.

(2) In the first embodiment, the switching circuit 26 is arranged between the bit line voltage generating circuit 23 and the bit line voltage adjusting circuit 25, the second voltage Vbias fixed by the first data line voltage adjusting circuit 27 is supplied to a non-selected bit line through the switching circuit 26 and the bit line voltage adjusting circuit 25 to reliably fix a potential of the non-selected bit line to the second voltage Vbias which is equal to that of the data line.

However, when it is assumed that a variation in potential of the non-selected bit line is not very large, the switching circuit 26 may be omitted, and any one of the first voltage Vread and the second voltage Vbias which are generated by the bit line voltage generating circuit 23 may be directly input to the non-inverted input terminal of the OP Amp 31 of the bit line voltage adjusting circuit.

(3) Similarly, in the second embodiment, the second voltage Vbias which is generated by the data line voltage generating circuit 24, fixed by the first data line voltage adjusting circuit 27, and further fixed by the first bit line voltage adjusting circuit 25a is supplied to a non-selected bit line. However, when it is assumed that a variation in potential of the non-selected bit line is not very large, the second voltage Vbias which is generated by the bit line voltage generating circuit 23 and fixed by the first bit line voltage adjusting circuit may be supplied to the non-selected bit line without passing through the first data line voltage adjusting circuit 27.

(4) In the second embodiment, although the second voltage Vbias fixed by the first data line voltage adjusting circuit 27 and further fixed by the first bit line voltage adjusting circuit 25a is applied to the non-selected bit line, a voltage fixed by the first data line voltage adjusting circuit may also be directly used as an input of the selecting circuit 29b without passing through the first bit line voltage adjusting circuit 25a. In this case, the first data line voltage adjusting circuit 27 also serves as the first bit line voltage adjusting circuit 25a, and the data line voltage generating circuit 24 serves as the bit line voltage generating circuit 23 for generating the second voltage Vbias.

Figure 15:
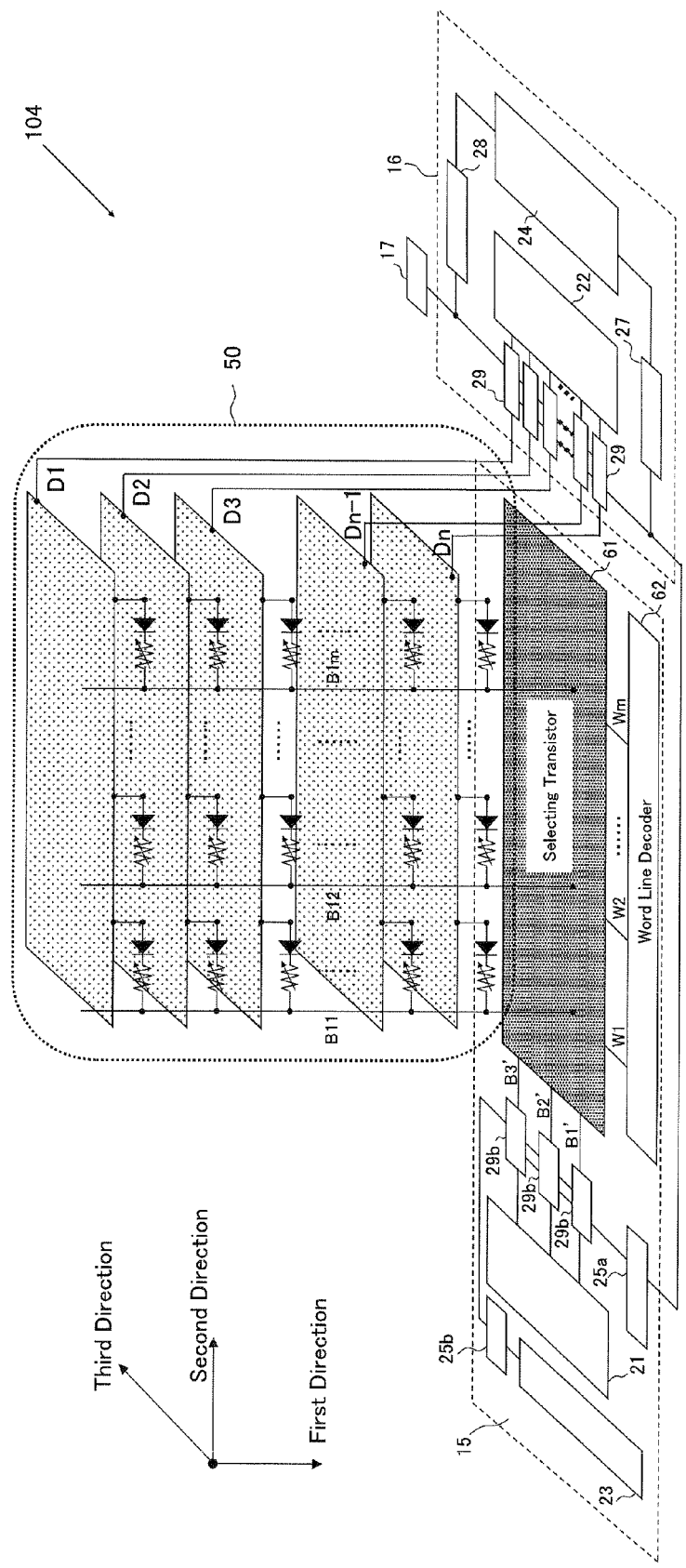
FIG. 15 is a circuit block diagram showing a schematic configuration of a nonvolatile semiconductor memory device according to another embodiment of the present invention.

(5) In the third embodiment, the bit line voltage supply circuit 15 and the data line voltage supply circuit 16 having the same circuit configurations as those of the present invention device 100 according to the first embodiment is used to perform reading from the three-dimensional memory cell array 50. However, the bit line voltage supply circuit 15 having the same circuit configuration as that of the second embodiment may also be used. FIG. 15 is a circuit block diagram of a nonvolatile semiconductor memory device 104 (to be arbitrarily referred to as a "present invention device 104" hereinafter) in which a three-dimensional memory cell array configuration is applied to the present invention device 101 according to the second embodiment. In the three-dimensional memory cell array 50 shown in FIG. 15, as in the third embodiment, one terminals (diode side) of the memory cells are connected to flat-plate-shaped data lines D1 to Dn which are parallel to the second direction and the third direction and perpendicular to the first direction, and the other ends (variable resistance element side) are connected to the bit lines B11 to B3m extending in the first direction. Each of the bit lines is connected to a second bit line through a corresponding transistor in the selecting transistor array. The second bit line is selected by the bit line decoder 21 and the selecting circuit 29b.

Figure 16:
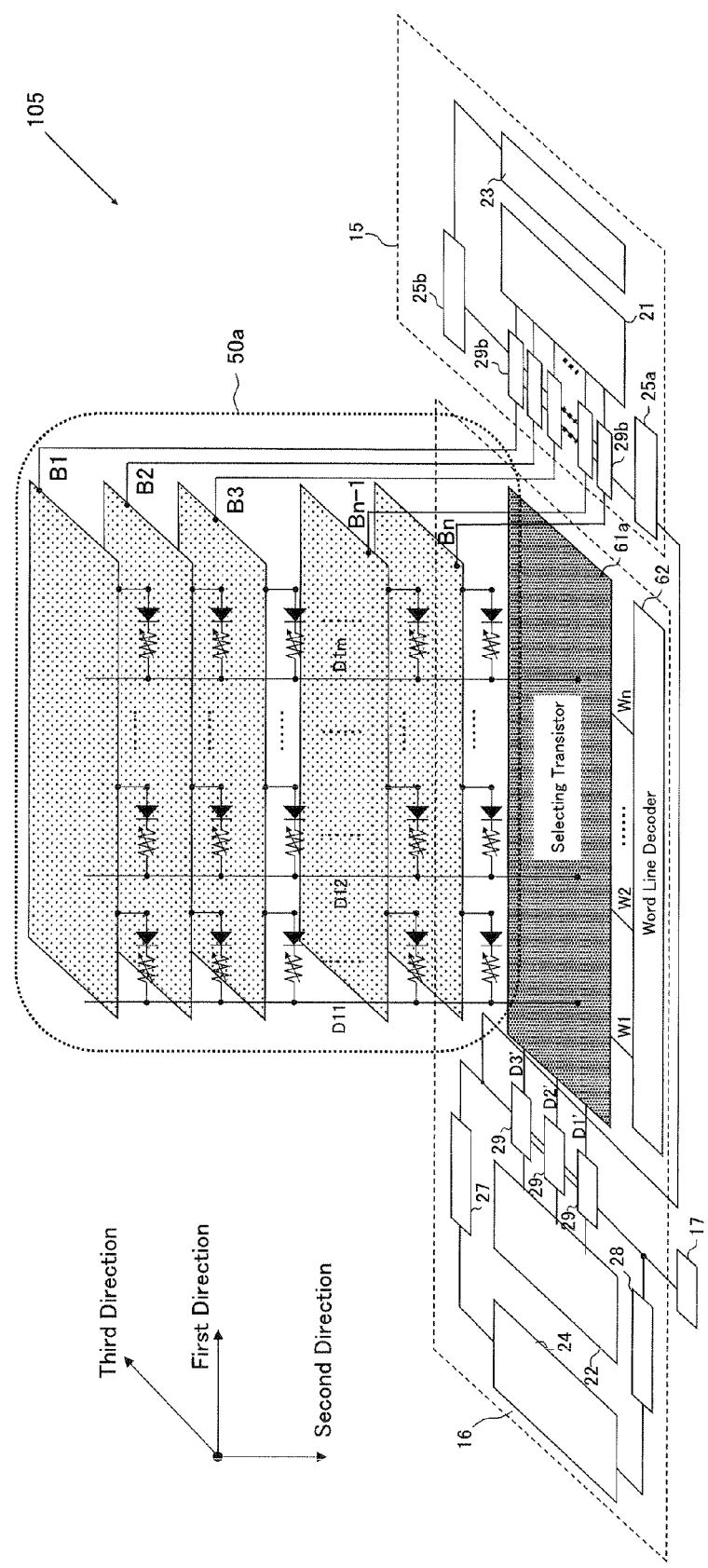
FIG. 16 is a circuit block diagram showing a schematic configuration of a nonvolatile semiconductor memory device according to still another embodiment of the present invention.
Figure 17:
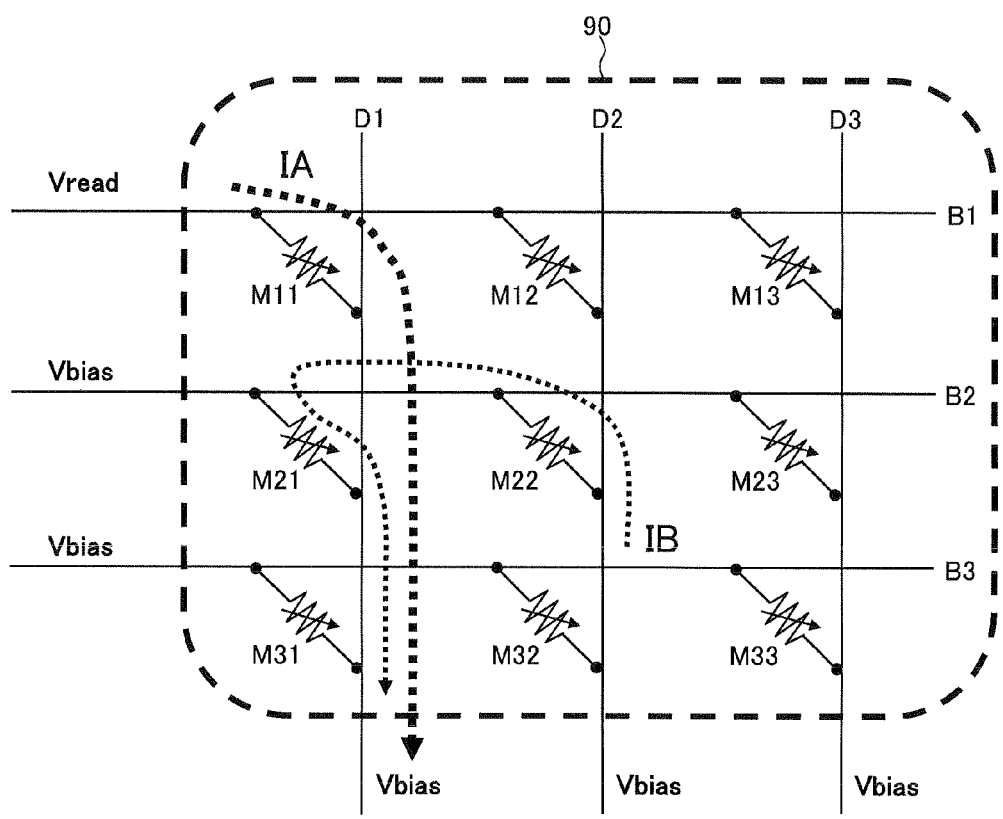
FIG. 17 is a diagram for explaining a read operation of a memory cell array of a nonvolatile semiconductor memory device having a conventional configuration.
Figure 18:
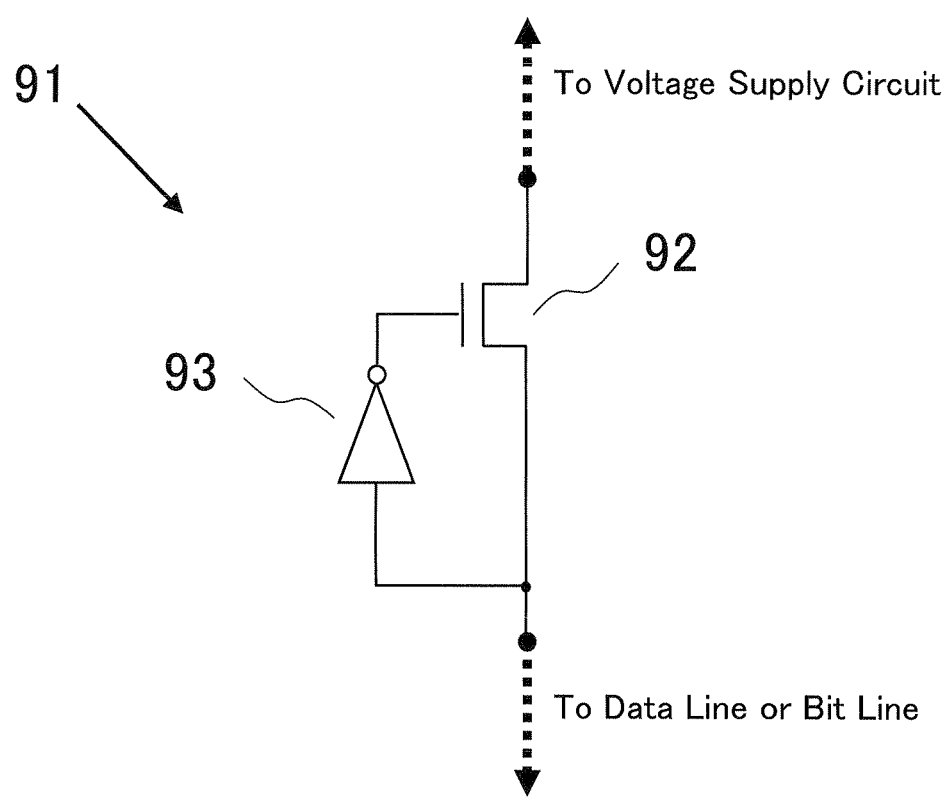
FIG. 18 is a circuit block diagram of a voltage adjusting circuit to suppress a leakage current in the nonvolatile semiconductor memory device having the conventional configuration.

Similarly, also in the present invention device 103 described in the fourth embodiment, the bit line voltage supply circuit 15 having the same circuit configuration as that of the second embodiment may also be used. FIG. 16 is a circuit block diagram of a nonvolatile semiconductor memory device 105 (present invention device 105) in which the three-dimensional array configuration of the present invention device 103 is applied to the present invention device 101 according to the second embodiment.

Also in the present invention device 104 and the present invention device 105, by the operations of the first bit line voltage adjusting circuit 25a, the second bit line voltage adjusting circuit 25b, the first data line voltage adjusting circuit 27, the second data line voltage adjusting circuit 28, and the selecting circuits 29 and 29b, voltages applied to a bit line and a data line are immediately fixed to a predetermined potential independently of a resistance distribution of variable resistance elements. For this reason, a leakage current can be suppressed. Furthermore, since a resistance of a variable resistance element can be prevented from being written by unexpected variations in voltage of a data line and a bit line, disturb is suppressed, and a read margin can be expected to be improved, and a large capacity memory can be achieved.

(6) In each of the present invention devices 102 to 105 according to the third and fourth embodiments and the other embodiment, in the selecting transistor array, the word line extends in the third direction, and the second bit line or the second data line extends in the first direction or the second direction perpendicular to the third direction. However, the second bit line or the second data line may extend in the third direction, and the word line may extend in the first direction or the second direction perpendicular to the third direction.

(7) Each of the first to fourth embodiments explains the configuration in which one first data line voltage adjusting circuit 27 and one second data line voltage adjusting circuit 28 are arranged, the first data line voltage adjusting circuit 27 fixes potentials of all non-selected data lines to the second voltage Vbias, and the second data line voltage adjusting circuit 28 fixes potentials of selected data lines to the second voltage Vbias. However, the plurality of first data line voltage adjusting circuits 27 and the plurality of second data line voltage adjusting circuits 28 may be arranged. When the plurality of first data line voltage adjusting circuits 27 are arranged, for example, the data lines are divided into groups the number of which is the same as the number of first data line voltage adjusting circuits 27, and, for each of the groups of the data lines, the corresponding first data line voltage adjusting circuit 27 supplies the fixed second voltage to the non-selected data line through the selecting circuit 29. Furthermore, when the plurality of second data line voltage adjusting circuits 28 are arranged, as described above, the second voltages fixed by the corresponding second data line voltage adjusting circuits 28 are independently applied to the plurality of selected data lines, respectively, to make it possible to simultaneously read data from a plurality of selected memory cells. This can also be applied to the present invention devices 104 and 105 according to the other embodiments. In the present invention devices 103 and 105, for example, the second data lines are divided into groups the number of which is the same as the number of first data line voltage adjusting circuits 27, and, for each of the groups of the second data lines, the corresponding first data line voltage adjusting circuit 27 supplies the fixed second voltage to the non-selected data line through the selecting circuit 29b and the selecting transistor array 61a.

(8) Similarly, the second embodiment describes the configuration in which one first bit line voltage adjusting circuit 25a and one second bit line voltage adjusting circuit 25b are arranged, the first bit line voltage adjusting circuit 25a fixes potentials of all non-selected bit lines to the second voltage Vbias, and the second bit line voltage adjusting circuit 25b fixes potentials of selected data lines to the first voltage Vread. However, the plurality of first bit line voltage adjusting circuits 25a and the plurality of second bit line voltage adjusting circuits 25b may be arranged. When the plurality of first bit line voltage adjusting circuits 25a are arranged, for example, the bit lines are divided into groups the number of which is the same as the number of first bit line voltage adjusting circuits 25a, and, for each of the groups of the bit lines, the corresponding first bit line voltage adjusting circuit 25a supplies the fixed second voltage to the non-selected bit line through the selecting circuit 29b. This can also be applied to the present invention devices 104 and 105 according to the other embodiments. In the present invention device 104, for example, the second bit lines are divided into groups the number of which is the same as the number of first bit line voltage adjusting circuits 25a, and, for each of the groups of the second bit lines, the corresponding first bit line voltage adjusting circuit 25a supplies the fixed second voltage to the non-selected bit line through the selecting circuit 29b and the selecting transistor array 61.

The present invention can be used in a nonvolatile semiconductor memory device and a nonvolatile semiconductor memory device including a nonvolatile variable resistance element which stores information by a change in electric resistance.

Although the present invention has been described in terms of a preferred embodiment, it will be appreciated that various modifications and alterations might be made by those skilled in the art without departing from the invention. The invention should therefore be measured in terms of the claims which follow.

What is claimed is:

1. A nonvolatile semiconductor memory device having a two-dimensional memory cell array in which a plurality of two-terminal memory cells each having a nonvolatile variable resistance element which stores information by a change in electric resistance are arranged in a form of a matrix in a first direction and a second direction perpendicular to each other, a plurality of bit lines extending in the first direction and a plurality of data lines extending in the second direction are arranged, one terminals of the memory cells located at the same position in the first direction are commonly connected to one of the data lines, and the other terminals of the memory cells located at the same position in the second direction are commonly connected to one of the bit lines, the nonvolatile semiconductor memory device comprising:
    a bit line voltage supply circuit which supplies, for each of the bit lines, a predetermined first voltage to a selected bit line connected to the other terminal of the memory cell selected as an object to be read and supplies a predetermined second voltage to a non-selected bit line connected to the other terminal of the non-selected memory cell serving as an object not to be read;
    a data line voltage supply circuit which supplies the second voltage to a selected data line connected to one terminal of the memory cell selected as an object to be read and a non-selected data line connected to one terminal of the non-selected memory cell serving as an object not to be read; and
    a sense circuit which detects a current flowing in the selected data line separately from a current flowing in the non-selected data line to detect an electric resistance state of the selected memory cell in reading, wherein
    the data line voltage supply circuit has a data line selecting circuit which independently sets each of the data lines to any one of the selected data line and the non-selected data line,
    the bit line voltage supply circuit has a bit line selecting circuit which independently sets each of the bit lines to any one of the selected bit line and the non-selected bit line,
    at least one of the bit line voltage supply circuit and the data line voltage supply circuit includes a voltage adjusting circuit having an operational amplifier and a MOS transistor having a gate terminal connected to an output terminal of the operational amplifier, a drain terminal connected to an inverted input terminal of the operational amplifier, and a source terminal connected to a predetermined fixed potential, and
    any one of the first voltage and the second voltage applied to the non-inverted input terminal of the operational amplifier is applied from the MOS transistor to at least one of the bit line and the data line through a connection node between the drain terminal of the MOS transistor and the inverted input terminal of the operational amplifier.

2. The nonvolatile semiconductor memory device according to claim 1, wherein
    the bit line voltage supply circuit includes a bit line voltage adjusting circuit,
    the bit line voltage adjusting circuit includes a first operational amplifier and a first MOS transistor having a gate terminal connected to an output terminal of the first operational amplifier, a drain terminal connected to an inverted input terminal of the first operational amplifier, and a source terminal connected to a predetermined fixed potential,
    any one of the first voltage and the second voltage is applied to a non-inverted input terminal of the first operational amplifier to fix a voltage of the inverted input terminal of the first operational amplifier to any one of the first voltage and the second voltage which is a voltage of a non-inverted input terminal of the first operational amplifier, and
    the fixed voltage is supplied from the first MOS transistor to the bit line through a connection node between the drain terminal of the first MOS transistor and the inverted input terminal of the first operational amplifier.

3. The nonvolatile semiconductor memory device according to claim 2, wherein
    the bit line voltage adjusting circuit is provided for each of the bit lines or each bit line group obtained by connecting the predetermined number of bit lines through corresponding selecting elements,
    the voltage of the inverted input terminal of the first operational amplifier of the corresponding bit line voltage adjusting circuit is fixed to the first voltage serving as the voltage of the non-inverted input terminal of the first operational amplifier depending on an output from the bit line selecting circuit when the bit line is the selected bit line or when the bit line group includes the selected bit line, and
    the voltage of the inverted input terminal of the first operational amplifier of the corresponding bit line voltage adjusting circuit is fixed to the second voltage serving as the voltage of the non-inverted input terminal of the first operational amplifier depending on the output from the bit line selecting circuit when the bit line is the non-selected bit line or when all the bit lines belonging to the bit line group are the non-selected bit lines.

4. The nonvolatile semiconductor memory device according to claim 2, wherein the bit line voltage supply circuit includes
    a first bit line voltage adjusting circuit which fixes the voltage of the inverted input terminal of the first operational amplifier to the second voltage serving as the voltage of the non-inverted input terminal of the first operational amplifier and supplies the fixed second voltage to the non-selected bit line through the connection node between the drain terminal of the first MOS transistor and the inverted input terminal of the first operational amplifier and the bit line selecting circuit.

5. The nonvolatile semiconductor memory device according to claim 4, wherein the bit line voltage supply circuit includes
a second bit line voltage adjusting circuit which fixes the voltage of the inverted input terminal of the first operational amplifier to the first voltage serving as the voltage of the non-inverted input terminal of the first operational amplifier and supplies the fixed first voltage to the selected bit line through the connection node between the drain terminal of the first MOS transistor and the inverted input terminal of the first operational amplifier and the bit line selecting circuit.

6. The nonvolatile semiconductor memory device according to claim 2, wherein
the data line voltage supply circuit includes a first data line voltage adjusting circuit,
the first data line voltage adjusting circuit includes a second operational amplifier and a second MOS transistor having a gate terminal connected to an output terminal of the second operational amplifier, a drain terminal connected to an inverted input terminal of the second operational amplifier, and a source terminal connected to a predetermined fixed potential,
the second voltage is applied to a non-inverted input terminal of the second operational amplifier to fix a voltage of the inverted input terminal of the second operational amplifier to the second voltage serving as a voltage of the non-inverted input terminal of the second operational amplifier, and
the fixed second voltage is supplied from the second MOS transistor to the non-selected data line through a connection node between the drain terminal of the second MOS transistor and the inverted input terminal of the second operational amplifier and the data line selecting circuit.

7. The nonvolatile semiconductor memory device according to claim 6, wherein
the sense circuits the number of which is greater than or equal to the number of selected data lines are provided,
the data line voltage supply circuit includes second data line voltage adjusting circuits the number of which is greater than or equal to the number of selected data lines,
each of the second data line voltage adjusting circuits includes a third operational amplifier and a third MOS transistor having a gate terminal connected to an output terminal of the third operational amplifier, a drain terminal connected to an inverted input terminal of the third operational amplifier, and a source terminal connected to a predetermined fixed potential,
the second voltage is applied to a non-inverted input terminal of the third operational amplifier to fix a voltage of the inverted input terminal of the third operational amplifier to the second voltage serving as a voltage of the non-inverted input terminal of the third operational amplifier, and
the fixed second voltage is independently supplied from the third MOS transistor to each of the selected data lines through a connection node between the drain terminal of the third MOS transistor and the inverted input terminal of the third operational amplifier and the data line selecting circuit and to each of inputs of the sense circuits through the connection node between the drain terminal of the third MOS transistor and the inverted input terminal of the third operational amplifier.

8. The nonvolatile semiconductor memory device according to claim 6, wherein
the bit line voltage supply circuit includes a circuit adapted to supply the fixed second voltage serving as the voltage of the inverted input terminal of the second operational amplifier to the non-selected bit line directly or through the bit line selecting circuit in place of the fixed second voltage serving as the voltage of the inverted input terminal of the first operational amplifier.

9. The nonvolatile semiconductor memory device according to claim 1, wherein
the data line voltage supply circuit includes a first data line voltage adjusting circuit,
the first data line voltage adjusting circuit includes a second operational amplifier and a second MOS transistor having a gate terminal connected to an output terminal of the second operational amplifier, a drain terminal connected to an inverted input terminal of the second operational amplifier, and a source terminal connected to a predetermined fixed potential,
the second voltage is applied to a non-inverted input terminal of the second operational amplifier to fix a voltage of the inverted input terminal of the second operational amplifier to the second voltage serving as a voltage of the non-inverted input terminal of the second operational amplifier, and
the fixed second voltage is supplied from the second MOS transistor to the non-selected data line through a connection node between the drain terminal of the second MOS transistor and the inverted input terminal of the second operational amplifier and the data line selecting circuit.

10. The nonvolatile semiconductor memory device according to claim 9, wherein
the sense circuits the number of which is greater than or equal to the number of selected data lines,
the data line voltage supply circuit includes second data line voltage adjusting circuits the number of which is greater than or equal to the number of selected data lines,
each of the second data line voltage adjusting circuits includes a third operational amplifier and a third MOS transistor having a gate terminal connected to an output terminal of the third operational amplifier, a drain terminal connected to an inverted input terminal of the third operational amplifier, and a source terminal connected to a predetermined fixed potential,
the second voltage is applied to a non-inverted input terminal of the third operational amplifier to fix a voltage of the inverted input terminal of the third operational amplifier to the second voltage serving as a voltage of the non-inverted input terminal of the third operational amplifier, and
the fixed second voltage is independently supplied from the third MOS transistor to each of the selected data lines through a connection node between the drain terminal of the third MOS transistor and the inverted input terminal of the third operational amplifier and the data line selecting circuit and to each of inputs of the sense circuits through the connection node between the drain terminal of the third MOS transistor and the inverted input terminal of the third operational amplifier.

11. The nonvolatile semiconductor memory device according to claim 1, wherein
a three-dimensional memory cell array in which the plurality of two-dimensional memory cell arrays are stacked in a third direction perpendicular to the first direction and the second direction is provided,
the data line connects one terminals of the memory cells located at the same position in the first direction in the second and third directions,
the bit line selecting circuit includes a selecting transistor array in which a plurality of selecting transistors adapted to select the bit line are arranged in a form of a two-dimensional matrix in the second direction and the third direction and adjacent to an arrangement area of the memory cells in the first direction, the bit lines located at the same position in any one of the second and third directions are connected to a common second bit line through the corresponding selecting transistors, respectively, control terminals of the selecting transistors located at the same position in the other of the second direction and the third direction are connected to a word line extending in any one of the second and third directions, and the bit line is selected by the second bit line and the word line, and the first voltage and the second voltage are supplied to the selected bit line and the non-selected bit line through the second bit line, respectively.

12. The nonvolatile semiconductor memory device according to claim 1, wherein a three-dimensional memory cell array in which the plurality of two-dimensional memory cell arrays are stacked in a third direction perpendicular to the first direction and the second direction is provided, the bit line connects other terminals of the memory cells located at the same position in the second direction in the first and third directions, the data line selecting circuit includes a selecting transistor array in which a plurality of selecting transistors adapted to select the data line are arranged in a form of a two-dimensional matrix in the first direction and the third direction and adjacent to an arrangement area of the memory cells in the second direction, the data lines located at the same position in any one of the first and third directions are connected to a common second data line through the corresponding selecting transistors, respectively, control terminals of the selecting transistors located at the same position in the other of the first and the third direction are connected to a word line extending in any one of the first and third directions, and the data line is selected by the second data line and the word line, and the second voltage is supplied to the selected data line and the non-selected data line through the second data line.

* * * * *